US007214456B2

(12) United States Patent
Iftime et al.

(10) Patent No.: US 7,214,456 B2

(45) Date of Patent: May 8, 2007

(54) REIMAGEABLE MEDIUM

(75) Inventors: Gabriel Iftime, Mississauga (CA); Naveen Chopra, Oakville (CA); Peter M. Kazmaier, Mississauga (CA)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/834,722

(22) Filed: Apr. 29, 2004

(65) Prior Publication Data

US 2005/0244743 A1 Nov. 3, 2005

(51) Int. Cl.
*G03F 7/004* (2006.01)

(52) U.S. Cl. .................... 430/19; 430/270.1; 430/345; 430/962

(58) Field of Classification Search .................. 430/19, 430/962, 270.1, 345
See application file for complete search history.

(56) References Cited

U.S. PATENT DOCUMENTS

| | | | | |
|---|---|---|---|---|
| 3,486,899 | A | 12/1969 | Brown | |
| 3,884,697 | A | 5/1975 | Inoue et al. | |
| 3,961,948 | A | 6/1976 | Saeva | 96/1 R |
| 4,365,012 | A | 12/1982 | Hocker et al. | |
| 4,794,068 | A * | 12/1988 | Miyazaki et al. | 430/345 |
| 5,266,447 | A * | 11/1993 | Takahashi et al. | 430/345 |
| 5,360,699 | A * | 11/1994 | Hibino et al. | 430/345 |
| 5,399,451 | A * | 3/1995 | Hashida et al. | 430/19 |
| 5,710,420 | A | 1/1998 | Martin et al. | 235/487 |
| 5,879,438 | A * | 3/1999 | Fujita et al. | 106/31.18 |
| 5,928,988 | A * | 7/1999 | Yamane et al. | 503/216 |
| 6,103,431 | A * | 8/2000 | Tamaoki et al. | 430/20 |
| 6,329,035 | B1 * | 12/2001 | Iwasaki et al. | 428/64.1 |

(Continued)

FOREIGN PATENT DOCUMENTS

GB 1226891 3/1971

(Continued)

OTHER PUBLICATIONS

Sebastian V. Kanakkanatt, "Photoerasing Paper and Thermocoloring Film," *SPIE*, vol. 3227, pp. 218-224 (1997).

(Continued)

*Primary Examiner*—Amanda Walke
(74) *Attorney, Agent, or Firm*—Zosan Soong

(57) ABSTRACT

An reimageable medium composed of: a substrate; and a photochromic material, wherein the medium is capable of exhibiting a color contrast and an absence of the color contrast, wherein the medium has a characteristic that when the medium exhibits the absence of the color contrast and is then exposed to an imaging light corresponding to a predetermined image to result in an exposed region and a non-exposed region, the color contrast is present between the exposed region and the non-exposed region to form a temporary image corresponding to the predetermined image that is visible for a visible time, wherein the medium has a characteristic that when the temporary image is exposed to an indoor ambient condition for an image erasing time, the color contrast changes to the absence of the color contrast to erase the temporary image in all of the following: (i) when the indoor ambient condition includes darkness at ambient temperature, (ii) when the indoor ambient condition includes indoor ambient light at ambient temperature, and (iii) when the indoor ambient condition includes both the darkness at ambient temperature and the indoor ambient light at ambient temperature, and wherein the medium is capable of undergoing multiple cycles of temporary image formation and temporary image erasure.

22 Claims, 1 Drawing Sheet

U.S. PATENT DOCUMENTS

| | | | | |
|---|---|---|---|---|
| 6,358,655 | B1 | 3/2002 | Foucher et al. | 430/108.21 |
| 6,365,312 | B1 | 4/2002 | Foucher et al. | 430/108.21 |
| 6,500,245 | B1 | 12/2002 | McCue et al. | 106/31.16 |
| 6,815,679 | B2 * | 11/2004 | Azuma | 250/316.1 |
| 6,902,860 | B2 * | 6/2005 | Asawa et al. | 430/270.1 |

FOREIGN PATENT DOCUMENTS

| | | |
|---|---|---|
| GB | 1246186 | 9/1971 |
| JP | 02 294633 A | 12/1990 |
| JP | 03 261941 A | 11/1991 |
| JP | 09 254541 A | 9/1997 |
| JP | 2001 341428 A | 12/2001 |
| JP | 2003-131339 | 5/2003 |

OTHER PUBLICATIONS

Henri Bouas-Laurent et al., "Organic Photochromism," *Pure Appl. Chem.*, vol. 73, No. 4, pp. 639-665 (2001).

I. Kawashima et al., "20.4: Photon-Mode Full-Color Rewritable Image Using Photochromic Compounds," *SID 03 DIGEST*, pp. 851-853 (2003).

H. Hattori et al., "Development of Paper-like Rewritable Recording Media and Systems," *Asia Display / IDW '01*, pp. 15-18 (2001).

Peter M. Kazmaier et al., "Method for Forming Temporary Image", U.S. Appl. No. 10/835,518 filed simultaneously herewith.

Gabriel Iftime et al., "Reimageable medium with light absorbing material", U.S. Appl. No. 10/834,529 filed simultaneously herewith.

* cited by examiner

REIMAGEABLE MEDIUM

BACKGROUND OF THE INVENTION

Many paper documents are promptly discarded after being read. Although paper is inexpensive, the quantity of discarded paper documents is enormous and the disposal of these discarded paper documents raises significant cost and environmental issues. The present invention addresses the above described problem by providing in embodiments a new medium for containing the desired image, a new method to prepare such a medium, and a new image forming method.

The following documents provide background information:

Sebastian V. Kanakkanatt, "Photoerasing Paper and Thermocoloring Film," *SPIE*, Vol. 3227, pp. 218–224 (1997).

Henri Bouas-Laurent et al., "Organic Photochromism," *Pure Appl. Chem.*, Vol. 73, No. 4, pp. 639–665 (2001).

Martin et al., U.S. Pat. No. 5,710,420.

McCue et al., U.S. Pat. No. 6,500,245 B1.

Japanese Patent Document Laid Open No. 2003-131339 ("Reversible Image Display Medium, Method and Device").

I. Kawashima et al., "20.4: Photon-Mode Full-Color Rewritable Image Using Photochromic Compounds," *SID 03 DIGEST*, pp. 851–853 (2003).

H. Hattori et al., "Development of Paper-like Rewritable Recording Media and Systems," *Asia Display/IDW '01*, pp. 15–18 (2001).

Saeva, U.S. Pat. No. 3,961,948.

Foucher et al., U.S. Pat. No. 6,358,655 B1.

Foucher et al., U.S. Pat. No. 6,365,312 B1.

SUMMARY OF THE DISCLOSURE

There is provided in embodiments an image forming method comprising:

(a) providing a reimageable medium comprised of a substrate and a photochromic material, wherein the medium is capable of exhibiting a color contrast and an absence of the color contrast;

(b) exposing the medium to an imaging light corresponding to a predetermined image to result in an exposed region and a non-exposed region, wherein the color contrast is present between the exposed region and the non-exposed region to allow a temporary image corresponding to the predetermined image to be visible for a visible time;

(c) subjecting the temporary image to an indoor ambient condition for an image erasing time to change the color contrast to the absence of the color contrast to erase the temporary image without using an image erasure device; and (d) optionally repeating procedures (b) and (c) a number of times to result in the medium undergoing a number of additional cycles of temporary image formation and temporary image erasure.

There is also provided in embodiments, an image forming method comprising:

(a) providing a two-sided flexible medium comprised of a white paper substrate and a photochromic material, wherein the medium is reimageable on both sides, wherein the medium is capable of exhibiting a color contrast and an absence of the color contrast;

(b) exposing the medium to an imaging light corresponding to a predetermined image to result in an exposed region and a non-exposed region, wherein the color contrast is present between the exposed region and the non-exposed region to allow a temporary image corresponding to the predetermined image to be visible for a visible time;

(c) subjecting the temporary image to an indoor ambient condition for an image erasing time to change the color contrast to the absence of the color contrast to erase the temporary image without using an image erasure device; and (d) optionally repeating procedures (b) and (c) a number of times to result in the medium undergoing a number of additional cycles of temporary image formation and temporary image erasure.

In further embodiments, there is provided a reimageable medium comprising:

a substrate; and a photochromic material, wherein the medium is capable of exhibiting a color contrast and an absence of the color contrast, wherein the medium has a characteristic that when the medium exhibits the absence of the color contrast and is then exposed to an imaging light corresponding to a predetermined image to result in an exposed region and a non-exposed region, the color contrast is present between the exposed region and the non-exposed region to form a temporary image corresponding to the predetermined image that is visible for a visible time, wherein the medium has a characteristic that when the temporary image is exposed to an indoor ambient condition for an image erasing time, the color contrast changes to the absence of the color contrast to erase the temporary image in all of the following: (i) when the indoor ambient condition includes darkness at ambient temperature, (ii) when the indoor ambient condition includes indoor ambient light at ambient temperature, and (iii) when the indoor ambient condition includes both the darkness at ambient temperature and the indoor ambient light at ambient temperature, and wherein the medium is capable of undergoing multiple cycles of temporary image formation and temporary image erasure.

Other embodiments of the present invention include a reimageable medium comprising:

a paper substrate; and a photochromic material, wherein the medium is flexible with two sides and the photochromic material is present on the two sides to enable the two sides to be both reimageable, wherein the medium is capable of exhibiting a color contrast and an absence of the color contrast, wherein the medium has a characteristic that when the medium exhibits the absence of the color contrast and is then exposed to an imaging light corresponding to a predetermined image to result in an exposed region and a non-exposed region, the color contrast is present between the exposed region and the non-exposed region to form a temporary image corresponding to the predetermined image that is visible for a visible time, wherein the medium has a characteristic that when the temporary image is exposed to an indoor ambient condition for an image erasing time, the color contrast changes to the absence of the color contrast to erase the temporary image in all of the following: (i) when the indoor ambient condition includes darkness at ambient temperature, (ii) when the indoor ambient condition includes indoor ambient light at ambient temperature, and (iii) when the indoor ambient condition includes both the darkness at ambient temperature and the indoor ambient light at ambient temperature, and wherein the medium is capable of undergoing multiple cycles of temporary image formation and temporary image erasure.

In additional embodiments, there is provided a reimageable medium for receiving an imaging light having a predetermined wavelength scope, the medium comprising:

a substrate;

a photochromic material capable of reversibly converting among a number of different forms, wherein one form has an absorption spectrum that overlaps with the predetermined wavelength scope; and a light absorbing material exhibiting a light absorption band with an absorption peak, wherein the light absorption band overlaps with the absorption spectrum of the one form.

Other embodiments of the present invention include a reimageable medium for receiving an imaging light having a predetermined wavelength scope, the medium comprising:

a substrate;

a photochromic material capable of reversibly converting among a number of different forms, wherein one form has an absorption spectrum that overlaps with the predetermined wavelength scope; and a light absorbing material exhibiting a light absorption band with an absorption peak, wherein the light absorption band overlaps with the absorption spectrum of the one form, wherein the medium is capable of exhibiting a color contrast and an absence of the color contrast, wherein the medium has a characteristic that when the medium exhibits the absence of the color contrast and is then exposed to the imaging light corresponding to a predetermined image to result in an exposed region and a non-exposed region, the color contrast is present between the exposed region and the non-exposed region to form a temporary image corresponding to the predetermined image that is visible for a visible time, wherein the medium has a characteristic that when the temporary image is exposed to an indoor ambient condition for an image erasing time, the color contrast changes to the absence of the color contrast to erase the temporary image in all of the following: (i) when the indoor ambient condition includes darkness at ambient temperature, (ii) when the indoor ambient condition includes indoor ambient light at ambient temperature, and (iii) when the indoor ambient condition includes both the darkness at ambient temperature and the indoor ambient light at ambient temperature, and wherein the medium is capable of undergoing multiple cycles of temporary image formation and temporary image erasure.

In embodiments, there is also provided a method for preparing a reimageable medium for receiving an imaging light having a predetermined wavelength scope, the method comprising:

incorporating as part of the medium a photochromic material capable of reversibly converting among a number of different forms, wherein one form has an absorption spectrum that overlaps with the predetermined wavelength scope; and incorporating as part of the medium a light absorbing material exhibiting a light absorption band with an absorption peak, wherein the light absorption band overlaps with the absorption spectrum of the one form, wherein the medium is capable of exhibiting a color contrast and an absence of the color contrast, wherein the medium has a characteristic that when the medium exhibits the absence of the color contrast and is then exposed to the imaging light corresponding to a predetermined image to result in an exposed region and a non-exposed region, the color contrast is present between the exposed region and the non-exposed region to form a temporary image corresponding to the predetermined image that is visible for a visible time, wherein the medium has a characteristic that when the temporary image is exposed to an indoor ambient condition for an image erasing time, the color contrast changes to the absence of the color contrast to erase the temporary image in all of the following: (i) when the indoor ambient condition includes darkness at ambient temperature, (ii) when the indoor ambient condition includes indoor ambient light at ambient temperature, and (iii) when the indoor ambient condition includes both the darkness at ambient temperature and the indoor ambient light at ambient temperature, and wherein the medium is capable of undergoing multiple cycles of temporary image formation and temporary image erasure.

DETAILED DESCRIPTION

Figure 1:
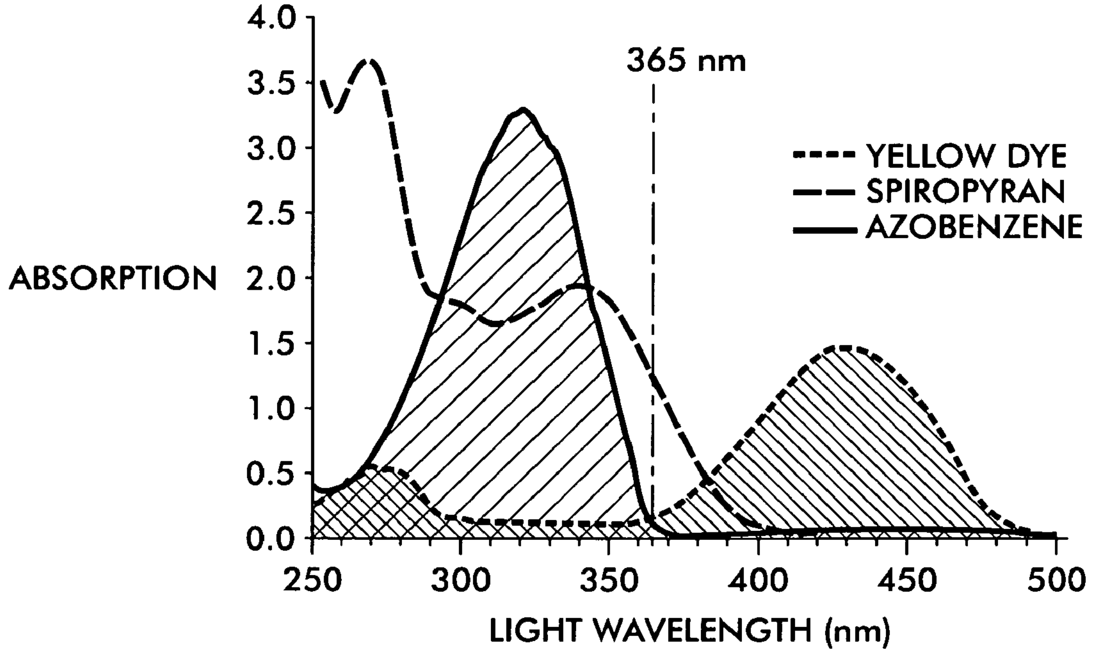
FIG. 1 represents the UV-VIS absorption spectrum of two exemplary light absorbing materials and also the UV-VIS absorption spectrum of spiropyran.

The term "image" as used in "predetermined image" and "temporary image" can be any marking that a person wishes to view where the "image" can be for example words, a picture, graphics, or a combination thereof.

The term "ambient temperature" refers to a temperature ranging from about 15 to about 30 degrees C.

The present method involves providing a reimageable medium composed of a substrate and a photochromic material, wherein the medium is capable of exhibiting a color contrast and an absence of the color contrast. The reimageable medium is exposed to an imaging light corresponding to a predetermined image to result in an exposed region and a non-exposed region, wherein the color contrast is present between the exposed region and the non-exposed region to allow a temporary image corresponding to the predetermined image to be visible to the naked eye.

To erase the temporary image, the present method subjects the temporary image to an indoor ambient condition for an image erasing time to change the color contrast to the absence of the color contrast to erase the temporary image without using an image erasure device, wherein the temporary image is visible for a visible time sufficient for the observer to view the temporary image but wherein the visible time is limited to permit the optional feature of repeating the procedures described herein for temporary image formation and temporary image erasure a number of times to result in the medium undergoing a number of additional cycles of temporary image formation and temporary image erasure. In embodiments, the reimageable medium may be considered "self-erasing."

The imaging light may have any suitable predetermined wavelength scope of a single wavelength or a band of wavelengths. In embodiments, the imaging light is an ultraviolet light having a single wavelength or a narrow band of wavelengths selected from the ultraviolet light wavelength range of about 200 nm to about 475 nm, particularly a single wavelength at 365 nm or a wavelength band of about 360 nm to about 370 nm. For each temporary image, the reimageable medium is exposed to the imaging light for a time period ranging from about 10 milliseconds to about 5 minutes, particularly from about 30 milliseconds to about 1 minute. The imaging light has an intensity ranging from about 0.1 $mW/cm^2$ to about 100 $mW/cm^2$, particularly from about 0.5 $mW/cm^2$ to about 10 $mW/cm^2$.

In embodiments, imaging light corresponding to the predetermined image can be generated for example by a computer on a Light Emitting Diode (LED) array screen and the temporary image is formed on the reimageable medium by placing the medium on the LED screen for the preferred period of time. UV LED arrays of for example 396 nm are produced by EXFO (Mississauga, ON, Canada). Another suitable procedure for generating the imaging light corresponding to the predetermined image is the use of UV Raster Output Scanner (ROS).

The color contrast to render the temporary image visible to an observer can be a contrast between for example two, three or more different colors. The term "color" encompasses a number of aspects such as hue, lightness, and saturation where one color can be different from another color if the two colors differ in at least one aspect. For example, two colors having the same hue and saturation but are different in lightness would be considered different colors. Any suitable colors (e.g., red, white, black, gray, yellow and purple) can be used to produce the color contrast as long as the temporary image is visible to the naked eye. In embodiments, the following exemplary color contrasts can be used: purple temporary image on a white background; yellow temporary image on a white background; dark purple temporary image on a light purple background; and light purple temporary image on a dark purple background.

In embodiments, the color contrast may change (e.g., diminish) during the visible time, but the phrase "color contrast" encompasses any degree of color contrast sufficient to render a temporary image discernable to the observer regardless whether the color contrast changes or is constant during the visible time.

The visible time for the temporary image ranges for example from about 1 hour to about 5 days, or from about 3 hours to about 24 hours. In embodiments, fading of the temporary image (due to a decrease in the color contrast) may be noticeable within the visible time described herein, but the visible time indicates the time period when the temporary image is discernable to the naked eye.

The indoor ambient condition is composed of darkness at ambient temperature, or indoor ambient light at ambient temperature, or both the darkness at ambient temperature and the indoor ambient light at ambient temperature. The indoor ambient light is for example the typical office lighting where the indoor ambient light may be entirely artificial light (e.g., light from an incandescent bulb and/or fluorescent bulb), or entirely sunlight coming in through a glass window, or a mixture of artificial light and sunlight coming through a glass window. Where the indoor ambient condition includes darkness at ambient temperature, the term "darkness" refers to a low light level where the office lighting is turned off and where there is insignificant amount of sunlight entering the room (e.g., there is no window or the sun has set or the window drapes/blinds are closed). The term "darkness" also encompasses the nighttime situation where the office lighting is turned off, but there are "city lights" streaming into the room through the window. In embodiments of the present method, the reimageable medium with the temporary image is exposed to the indoor ambient condition for an image erasing time ranging for example from about 1 hour to about 5 days, or from about 3 hours to about 24 hours. In embodiments, since the temporary image typically remains under an indoor ambient condition during the entire visible time, the image erasing time includes the visible time. For example, if the temporary image is visible for 5 hours, then the image erasing time could be any value of 5 plus hours. In embodiments, the image erasing time exceeds the visible time by a time period of for example at least 30 minutes, or from about 1 hour to about 24 hours.

In embodiments of the present method and of the present reimageable medium, erasure of the temporary image can occur by any of the following: (i) changing the color of the exposed region (that is, exposed to the imaging light) to the color of the non-exposed region (that is, not exposed to the imaging light); (ii) changing the color of the non-exposed region to the color of the exposed region; or (iii) changing the color of the exposed region and of the color of the non-exposed region to the same color different from both the exposed region color and the non-exposed region color.

The photochromic material exhibits photochromism which is a reversible transformation of a chemical species induced in one or both directions by absorption of electromagnetic radiation between two forms having different absorption spectra. The first form is thermodynamically stable which can be induced by absorption of light to convert to a second form. The back reaction from the second form to the first form can occur for example thermally or by absorption of light. Embodiments of the photochromic material also encompass the reversible transformation of the chemical species among three or more forms in the event it is possible that reversible transformation can occur among more than two forms. The photochromic material may be composed of one, two, three or more different types of photochromic materials, where the term "type" refers to each family of reversibly interconvertible forms, e.g., spiropyran and and its isomer merocyanine collectively forming one type (also referred to as one family) of photochromic material. Unless otherwise noted, the term "photochromic material" refers to all molecules of the photochromic material regardless of form. For example, where the photochromic material is of a single type such as spiropyran/merocyanine, at any given moment the molecules of the photochromic material may be entirely spiropyran, entirely merocyanine, or a mixture of spiropyran and merocyanine. In embodiments, for each type of photochromic material, one form is colorless or weakly colored and the other form is differently colored.

When two or more types of photochromic materials are present, each type may be present in an equal or unequal amount by weight ranging for example from about 5% to about 90% based on the weight of all types of the photochromic material.

In embodiments, the photochromic material is also thermochromic, i.e., exhibits thermochromism which is a thermally induced reversible color change.

Any suitable photochromic material may be used, especially an organic photochromic material. Examples of suitable photochromic materials include compounds that undergo heterocyclic cleavage, such as spiropyrans and related compounds; compounds that undergo homocyclic cleavage such as hydrazine and aryl disulfide compounds; compounds that undergo cis-trans isomerization such as azo compounds, stilbene compounds and the like; compounds that undergo proton or group transfer phototautomerism such as photochromic quinines; compounds that undergo photochromism via electro transfer such as viologens and the like; and others.

As discussed herein, the photochromic material can exist in a number of forms which are depicted herein by illustrative structural formulas for each type of photochromic material. For the chemical structures identified herein one form of the photochromic material is typically colorless or weakly colored (e.g., pale yellow); whereas, the other form typically has a different color (e.g., red, blue, or purple) which is referred herein as "differently colored."

Suitable examples of the photochromic material include spiropyrans compounds and analogue compounds of the general formulas (the closed form may be colorless/weakly colored; the open form may be differently colored):

with from 1 to about 20 carbon atoms and more preferably with from 1 to about 10 carbon atoms, arylthio groups, preferably with from about 6 to about 20 carbon atoms and more preferably with from about 6 to about 10 carbon atoms, aldehyde groups, ketone groups, ester groups, amide groups, carboxylic acid groups, sulfonic acid groups, and the like. Further, two or more R groups (that is, $R_1$ through $R_{13}$) can be joined together to form a ring.

X can be Oxygen atom (O) or Sulphur atom (S). Y can be CH group, Nitrogen atom (N) or Phosphorus atom (P). Compounds with X=O and Y=CH, are known as spiropyrans. In this case, the closed form isomer is known as spiropyran compound, while the open form isomer is known as merocyanine compound. Compounds with X=O and

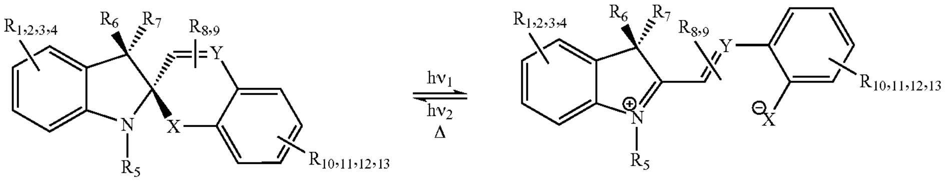

Closed form
(Spiropyran when X = O and Y = CH)

Open form
(Merocyanine when X = O and Y = CH)

wherein $R_1$, $R_2$, $R_3$, $R_4$, $R_5$, $R_6$, $R_7$, $R_8$, $R_9$, $R_{10}$, $R_{11}$, $R_{12}$, $R_{13}$each, independently of the others can be (but are not limited to) hydrogen, alkyl, including cyclic alkyl groups, such as cyclopropyl, cyclohexyl, and the like, and including unsaturated alkyl groups, such as vinyl ($H_2C{=}CH{-}$), allyl ($H_2C{=}CH{-}CH_2{-}$), propynyl ($HC{\equiv}C{-}CH_2{-}$), and the like, preferably with from 1 to about 50 carbon atoms and more preferably with from 1 to about 30 carbon atoms, aryl, preferably with from about 6 to about 30 carbon atoms and more preferably with from about 6 to about 20 carbon atoms, arylalkyl, preferably with from about 7 to about 50 carbon atoms and more preferably with from about 7 to about 30 carbon atoms, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 50 carbon atoms and more preferably with from 1 to about 30 carbon atoms, aryloxy groups, preferably with from about 6 to about 30 carbon atoms and more preferably with from about 6 to about 20 carbon atoms, alkylthio groups, preferably with from 1 to about 50 carbon atoms and more preferably with from 1 to about 30 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. The alkyl, aryl, and arylalkyl groups can also be substituted with groups such as, for example, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 20 carbon atoms and more preferably with from 1 to about 10 carbon atoms, aryloxy groups, preferably with from about 6 to about 20 carbon atoms and more preferably with from about 6 to about 10 carbon atoms, alkylthio groups, preferably Y=N, are known as spiroxazines. Compounds with X=S and Y=CH are known as spirothiopyrans.

Examples of spiropyrans include spiro[2H-1-benzopyran-2,2'-indolines], including those of the general formula I wherein substituents can be present on one or more of the 1', 3', 4', 5', 6', 7', 3, 4, 5, 6, 7, and 8 positions, spiroindolinonaphthopyrans, including those of the general formula II, wherein substituents can be present on one or more of the 1, 3, 4, 5, 6, 7, 1', 2', 5', 6', 7', 8', 9' or 10' positions, aza-spiroindolinopyrans, including those of the general formula III, wherein substituents can be present on one or more of the 3, 4, 5, 6, 7, 3', 4', 5', 6', 7', 8', and 9' positions.

I

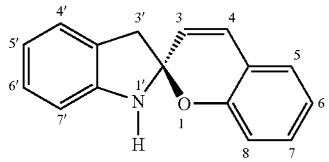

II

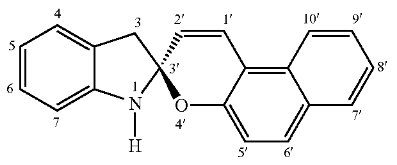

-continued

III

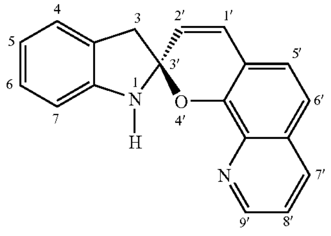

Examples of spirooxazines include spiro[indoline-2,3'-[3H]-naphtho[2,1-b]-1,4-oxazines], including those of the general formula IV, wherein substituents can be present on one or more of the 1, 3, 4, 5, 6, 7, 1', 2', 5', 6', 7', 8', 9', or 10' positions, spiro[2H-1,4-benzoxazine-2,2'-indolines], including those of the general formula V, wherein substituents can be present on one or more of the 3, 5, 6, 7, 8, 1', 4', 5', 6', and 7' positions, and the like.

Examples of spirothiopyrans include spiro[2H-1-benzothiopyran-2,2'-indolines], including those of the general formula VI, wherein substituents can be present on one or more of the 1', 3', 4', 5', 6', 7', 3, 4, 5, 6, 7, and 8 positions, and the like.

IV

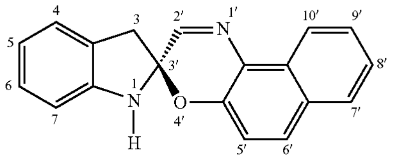

V

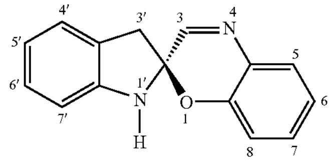

VI

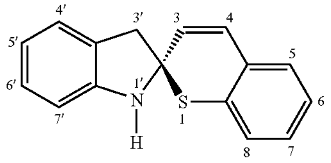

In all of the above examples of spiropyrans, spirooxazines and spirothiopyrans, examples of substituents are the same as described for $R_1$, $R_2$, $R_3$, $R_4$, $R_5$, $R_6$, $R_7$, $R_8$, $R_9$, $R_{10}$, $R_{11}$, $R_{12}$ and $R_{13}$.

Electron donor substituents like for example amino, alkoxy or groups and electron donor substituents like for example nitro or cyan on spiropyran, spirooxazine, and spirothiopyran can be adjusted to affect the color of the open form of the photochromic material, as well as the absorption spectrum of the closed form. Substituents on the central moiety of the spiropyrans, spirooxazines, and spirothiopyrans or on alkyl or aryl groups attached thereto also affect the color of the open form of the photochromic material, although to a lesser degree than substituents on the left ring. Further, substituents can be tuned as to affect the solubility of the compound in various liquids and resins. Substitutents with long chain hydrocarbons, such as those with 16 or 18 carbon atoms, can increase solubility in hydrocarbons. Sulfonate and carboxylate groups, for example, can enhance water solubility.

Specific examples of spiropyrans, spirooxazines, and spirothiopyrans include 1',3'-dihydro-1',3',3'-trimethyl-6-nitrospiro-[2H-1-benzopyran-2,2'-(2H)-indole]; 1',3'-dihydro-1',3',3'-trimethyl-5'-nitrospiro-[2H-1-benzopyran-2,2'-(2H)-indole], 1',3'-dihydro-1',3',3'-trimethyl-6-cyano-spiro-[2H-1-benzopyran-2,2'-(2H)-indole], 1',3'-dihydro-1',3',3'-trimethyl-8-nitrospiro-[2H-1-benzopyran-2,2'-(2H)-indole], 1',3'-dihydro-1',3',3'-trimethyl-6-nitro, 8-methoxy-spiro-[2H-1-benzopyran-2,2'-(2H)-indole], 1',3'-dihydro-1'-decyl-,3',3'-dimethyl-6-nitrospiro-[2H-1-benzopyran-2,2'-(2H)-indole], 1,3-dihydro-1,3,3-trimethylspiro[2H-indole-2,3'-[3H]naphth[2,1-b]-[1,4]oxazine], 1,3-dihydro-1,3,3-trimethyl-5-nitrospiro[2H-indole-2,3'-[3H]naphth[2,1-b]-[1,4]oxazine], 1,3-dihydro-1,3,3-trimethyl-5,6'-dinitro-spiro[2H-indole-2,3'-[3H]naphth[2,1-b]-[1,4]oxazine], 1,3-dihydro-1,3,3-trimethyl-5-methoxy, 5'-methoxy-spiro[2H-indole-2,3'-[3H]naphth[2,1-b]-[1,4]oxazine], 1,3-dihydro-1-ethyl-3,3-dimethyl-5'-nitrospiro[2H-indole -2,3'-[3H]naphth[2,1-b]-[1,4]oxazine], 1,3',3'-trimethylspiro[2H-1-benzothiopyran-2,2'-indoline].

A representative methodology for synthesis of spiropyrans is by condensation of a readily available Fisher's base with salicylaldehyde derivatives. Extensive coverage of synthetic procedures and references are described in J. C. Crano and R. J. Guglielmetti, Organic Photochromic and Thermochromic Compounds, Vol. 1, Main Photochromic Families (Topics in Applied Chemistry), Plenum Press, New York (1999), the disclosure of which is totally incorporated herein by reference.

Another class of suitable photochromic materials are stilbenes of general formulas (the Cis form may be colorless/weakly colored; the Trans form may be differently colored):

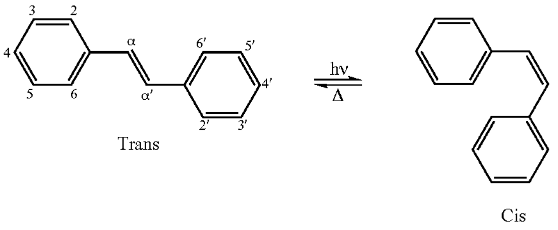

wherein one, two, three or more substituents may be optionally present at the 2, 3, 4, 5, 6, 2', 3', 4', 5', and 6' positions. Examples of suitable substituents include (but are not limited to) alkyl, including cyclic alkyl groups, such as cyclopropyl, cyclohexyl, and the like, and including unsaturated alkyl groups, such as vinyl ($H_2C{=}CH$), allyl ($H_2C{=}CH{-}CH_2{-}$), propynyl ($HC{\equiv}C{-}CH_2{-}$), and the like, preferably with from 1 to about 50 carbon atoms and more preferably with from 1 to about 30 carbon atoms, aryl, preferably with from about 6 to about 30 carbon atoms and more preferably with from about 6 to about 20 carbon atoms, arylalkyl, preferably with from about 7 to about 50 carbon atoms and more preferably with from about 7 to about 30 carbon atoms, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 50 carbon atoms and more preferably with from 1 to about 30 carbon atoms, aryloxy groups, preferably with from about 6 to about 30 carbon atoms and more preferably with from about 6 to about 20 carbon atoms, alkylthio groups, preferably with from 1 to about 50 carbon atoms and more preferably with from 1 to about 30 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. The alkyl, aryl, and arylalkyl groups can also be substituted with groups such as, for example, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 30 carbon atoms and more preferably with from 1 to about 20 carbon atoms, aryloxy groups, preferably with from about 6 to about 30 carbon atoms and more preferably with from about 6 to about 20 carbon atoms, alkylthio groups, preferably with from 1 to about 30 carbon atoms and more preferably with from 1 to about 20 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. Further, two or more substituents can be joined together to form a ring.

Specific examples of stilbenes include stilbene (no substituents), 3-methylstilbene, 4-methoxystilbene, 3-methoxystilbene, 4-aminostilbene, 4-fluorostilbene, 3-fluorostilbene, 4-chlorostilbene, 3-chlorostilbene, 4-bromostilbene, 3-bromostilbene, 3-iodostilbene, 4-cyanostilbene, 3-cyanostilbene, 4-acetylstilbene, 4-benzoylstilbene, 4-phenacylstilbene, 4-nitrostilbene, 3-nitrostilbene, 3-nitro-3'-methoxystilbene, 3-nitro-4-dimethylaminostilbene, 4,4'-dinitrostilbene, 4-nitro-4'-methoxystilbene, 4-nitro-3'-methoxystilbene, 4-nitro-4'-aminostilbene, 4-nitro-4'-dimethylaminostilbene, α-methylstilbene, α,α'-dimethylstilbene, α,α'-difluorostilbene, α,α'-dichlorostilbene, 2,4,6-trimethylstilbene, 2,2',4,4',6,6'-hexamethylstilbene, and the like. Stilbene compounds are well known and can be prepared as described in, for example, G. S. Hammond et al., J. Amer. Chem. Soc., vol. 86, p. 3197 (1964), W. G. Herkstroeter et al., J. Amer. Chem. Soc., vol. 88, p. 4769 (1966), D. L. Beveridge et al., J. Amer. Chem. Soc., vol. 87, p. 5340 (1965), D. Gegiou et al., J. Amer. Chem. Soc., vol. 90, p. 3907 (1968), D. Schulte-Frohlinde et al., J. Phys. Chem., vol. 66, p. 2486 (1962), S. Malkin et al., J. Phys. Chem., vol. 68, p. 1153 (1964), S. Malkin et al., J. Phys. Chem., vol. 66, p. 2482 (1964), H. Stegemeyer, J. Phys. Chem., vol. 66, p. 2555 (1962), H. Gusten et al., Tetrahedron Lett., vol. 1968, p. 3097 (1968), D. Gegiou et al., J. Amer. Chem. Soc., vol. 90, p. 12 (1968), K. Kruger et al., J. Phys. Chem., vol. 66, p. 293 (1969), and D. Schulte-Frohlinde, Ann., vol. 612, p. 138 (1958), the disclosures of each of which are totally incorporated herein by reference.

Aromatic azo compounds which exhibit photochromism are of the general formulas (the Cis form may be colorless/weakly colored; the Trans form may be differently colored):

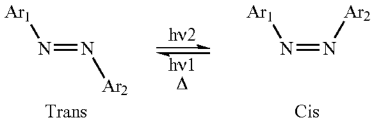

wherein $Ar_1$ and $Ar_2$ are each, independently of the other, selected from the group consisting of aromatic groups. The aromatic groups can be substituted, with examples of substituents including (but not limited to) alkyl, including cyclic alkyl groups, such as cyclopropyl, cyclohexyl, and the like, and including unsaturated alkyl groups, such as vinyl ($H_2C{=}CH{-}$), allyl ($H_2C{=}CH{-}CH_2{-}$), propynyl ($HC{\equiv}C{-}CH_2{-}$), and the like, preferably with from 1 to about 50 carbon atoms and more preferably with from 1 to about 30 carbon atoms, aryl, preferably with from about 6 to about 30 carbon atoms and more preferably with from about 6 to about 20 carbon atoms, arylalkyl, preferably with from about 7 to about 50 carbon atoms and more preferably with from about 7 to about 30 carbon atoms, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 50 carbon atoms and more preferably with from 1 to about 30 carbon atoms, aryloxy groups, preferably with from about 6 to about 30 carbon atoms and more preferably with from about 6 to about 20 carbon atoms, alkylthio groups, preferably with from 1 to about 50 carbon atoms and more preferably with from 1 to about 30 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. Alkyl, aryl, and arylalkyl substituents can also be further substituted with groups such as, for example, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 30 carbon atoms and more preferably with from 1 to about 20 carbon atoms, aryloxy groups, preferably with from about 6 to about 30 carbon atoms and more preferably with from about 6 to about 20 carbon atoms, alkylthio groups, preferably with from 1 to about 30 carbon atoms and more preferably with from 1 to about 20 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. Further, two or more substituents can be joined together to form a ring.

Examples of photochromic azo compounds include azobenzene, 2-methoxyazobenzene, 2-hydroxyazobenzene, 3-methylazobenzene, 3-nitroazobenzene, 3-methoxyazobenzene, 3-hydroxyazobenzene, 4-iodoazobenzene, 4-methylazobenzene, 4-carbomethoxyazobenzene, 4-acetylazobenzene, 4-carboxyazobenzene, 4-cyanoazobenzene, 4-ethoxyazobenzene, 4-methoxyazobenzene, 4-nitroazobenzene, 4-acetamidoazobenzene, 4-dimethylaminoazobenzene, 4-aminoazobenzene, 4-trimethylammonium azobenzene, 4-dimethylamino-4'-phenylazobenzene, 4-dimethylamino-4'-hydroxyazobenzene, 4,4'-bis-(dimethylamino)azobenzene, 4-dimethylamino-4'-p-aminophenylazobenzene, 4-dimethylamino-4'-p-acetamidophenylazobenzene, 4-dimethylamino-4'-p-aminobenzylazobenzene, 4-dimethylamino-4'-mercuric acetate azobenzene, 4-hydroxyazobenzene, 2-methyl-4-hydroxyazobenzene, 4-hydroxy-4'-methylazobenzene, 2,6-dimethyl-4-hydroxyazobenzene, 2,2'-4',6,6'-pentamethyl-4-hydroxyazobenzene, 2,6-dimethyl-2',4',6'-trichloro-4-hydroxyazobenzene, 4-hydroxy-4'-chloroazobenzene, 2,2',4',6'-tetrachloro-4-hydroxyazobenzene, 3-sulfonate-4-hydroxyazobenzene, 2,2'-dimethoxyazobenzene, 3,3'-dinitroazobenzene, 3,3'-dimethylazobenzene, 4,4'-dimethylazobenzene, 4,4'-dimethoxyazobenzene.

Polymeric azo materials are also suitable as the photochromic material. Aromatic azo compounds are well known and can be prepared as described in, for example, A. Natansohn et al., Macromolecules, vol. 25, p. 2268 (1992); G. Zimmerman et al., J. Amer. Chem. Soc., vol. 80, p. 3528 (1958); W. R. Brode, in The Roger Adams Symposium, p. 8, Wiley (New York 1955); D. Gegiou et al., J. Amer. Chem. Soc., vol. 90, p. 3907 (1968); S. Malkin et al., J. Phys. Chem., vol. 66, p. 2482 (1962); D. Schulte-Frohlinde, Ann., vol. 612, p. 138 (1958); E. I. Stearns, J. Opt. Soc. Amer., vol. 32, p. 382 (1942); W. R. Brode et al., J. Amer. Chem. Soc., vol 74, p. 4641 (1952); W. R. Brode et al., J. Amer. Chem. Soc., vol 75, p. 1856 (1953); E. Fischer et al., J. Chem. Phys., vol. 27, p. 328 (1957); G. Wettermark et al., J. Amer. Chem. Soc., vol. 87, p. 476 (1965); G. Gabor et al., J. Phys. Chem., vol. 72, p. 3266 (1968); M. N. Inscoe et al., J. Amer. Chem. Soc., vol 81, p. 5634 (1959); E. Fischer et al., J. Chem. Soc., vol. 1959, p. 3159 (1959); G. Gabor et al., J. Phys. Chem., vol. 66, p. 2478 (1962); G. Gabor et al., Israel J. Chem., vol. 5, p. 193 (1967); D. Bullock et al., J. Chem. Soc., vol. 1965, p. 5316 (1965); R. Lovrien et al., J. Amer. Chem. Soc., vol 86, p. 2315 (1964); J. H. Collins et al., J. Amer. Chem. Soc., vol. 84, p. 4708 (1962), the disclosures of each of which are totally incorporated herein by reference.

Also suitable as the photochromic material are benzo and naphthopyrans (Chromenes) of general formulas (the closed form may be colorless/weakly colored; the open form may be differently colored):

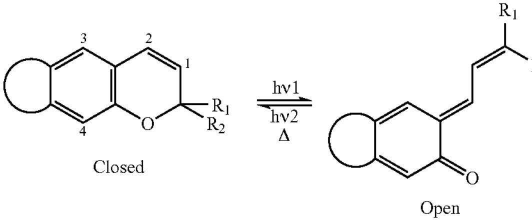

wherein one, two, three or more substituents may be optionally present at the 1, 2, 3 and 4 positions, wherein the substituents and $R_1$ and $R_2$ are each, independently of the other, selected from the group consisting of aromatic groups. The aromatic groups can be substituted, with examples of substituents including (but not limited to) alkyl, including cyclic alkyl groups, such as cyclopropyl, cyclohexyl, and the like, and including unsaturated alkyl groups, such as vinyl ($H_2C{=}CH{-}$), allyl ($H_2C{=}CH{-}CH_2{-}$), propynyl ($HC{\equiv}C{-}CH_2{-}$), and the like, preferably with from 1 to about 50 carbon atoms and more preferably with from 1 to about 30 carbon atoms, aryl, preferably with from about 6 to about 30 carbon atoms and more preferably with from about 6 to about 20 carbon atoms, arylalkyl, preferably with from about 7 to about 50 carbon atoms and more preferably with from about 7 to about 30 carbon atoms, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 50 carbon atoms and more preferably with from 1 to about 30 carbon atoms, aryloxy groups, preferably with from about 6 to about 30 carbon atoms and more preferably with from about 6 to about 20 carbon atoms, alkylthio groups, preferably with from 1 to about 50 carbon atoms and more preferably with from 1 to about 30 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. Alkyl, aryl, and arylalkyl substituents can also be further substituted with groups such as, for example, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 30 carbon atoms and more preferably with from 1 to about 20 carbon atoms, aryloxy groups, preferably with from about 6 to about 30 carbon atoms and more preferably with from about 6 to about 20 carbon atoms, alkylthio groups, preferably with from 1 to about 30 carbon atoms and more preferably with from 1 to about 20 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. Further, two or more substituents can be joined together to form a ring.

Specific examples of chromenes include 3,3-diphenyl-3H-naphtho[2,1-b]pyran; 2-methyl-7,7-diphenyl-7H-pyrano-[2,3-g]-benzothyazole; 2,2'-spiroadamantylidene-2H-naphtho-[1,2-b]pyran.

Synthesis of chromenes is described in detail for example in the following references: P. Bamfield, Chromic Phenomena, Technological applications of color chemistry, RSC, Cambridge, 2001 and J. C. Crano and R. J. Guglielmetti, Organic Photochromic and Thermochromic Compounds, Vol. 1, Main Photochromic Families (Topics in Applied Chemistry), Plenum Press, New York, 1999, the disclosures of which are totally incorporated herein by reference.

Bisimidazoles of the following general formulas are also suitable as the photochromic material (the form on the left may be colorless/weakly colored; the form on the right may be differently colored):

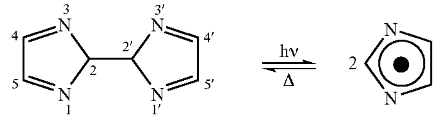

wherein one, two, three or more substituents may be optionally present at the 2, 4, 5, 2', 4', and 5' positions. Examples of substituents include (but are not limited to) alkyl, including cyclic alkyl groups, such as cyclopropyl, cyclohexyl, and the like, and including unsaturated alkyl groups, such as vinyl ($H_2C{=}CH{-}$), allyl ($H_2C{=}CH{-}CH_2{-}$), propynyl ($HC{\equiv}C{-}CH_2{-}$), and the like, preferably with from 1 to about 50 carbon atoms and more preferably with from 1 to about 30 carbon atoms, aryl, preferably with from about 6 to about 30 carbon atoms and more preferably with from about 6 to about 20 carbon atoms, arylalkyl, preferably with from about 7 to about 50 carbon atoms and more preferably with from about 7 to about 30 carbon atoms, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 50 carbon atoms and more preferably with from 1 to about 30 carbon atoms, aryloxy groups, preferably with from about 6 to about 30 carbon atoms and more preferably with from about 6 to about 20 carbon atoms, alkylthio groups, preferably with from 1 to about 50 carbon atoms and more preferably with from 1 to about 30 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. The alkyl, aryl, and arylalkyl groups can also be substituted with groups such as, for example, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 30 carbon atoms and more preferably with from 1 to about 20 carbon atoms, aryloxy groups, preferably with from about 6 to about 30 carbon atoms and more preferably with from about 6 to about 20 carbon atoms, alkylthio groups, preferably with from 1 to about 30 carbon atoms and more preferably with from 1 to about 20 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. Further, two or more substituents can be joined together to form a ring.

Specific examples of photochromic bisimidazoles include 2,2',4,4',5,5'-hexaphenyl bisimidazole, 2,2',4,4',5,5'-hexa-p-tolyl bisimidazole, 2,2',4,4',5,5'-hexa-p-chlorophenyl bisimidazole, 2,2'-di-p-chlorophenyl-4,4',5,5'-tetraphenyl bisimidazole, 2,2'-di-p-anisyl-4,4', 5,5'-tetraphenyl bisimidazole, and the like. Bisimidazole compounds are known, and can be prepared as described in, for example, Y. Sakaino, J. Chem. Soc., Perkin Trans I, p. 1063 (1983), T. Hayashi et al., Bull. Chem. Soc. Japan, vol. 33, p. 565 (1960), T. Hayashi et al., J. Chem. Phys., vol. 32, p. 1568 (1960), T. Hayashi et al., Bull. Chem. Soc. Japan, vol. 38, p. 2202 (1965), and D. M. White et al., J. Org. Chem., vol. 29, p. 1926 (1964), the disclosures of each of which are totally incorporated herein by reference.

Spirodihydroindolizines and related systems (tetrahydro- and hexahydroindolizine are also suitable photochromic materials. The general formulas of spirodihydroindolizines are shown below (the closed form may be colorless/weakly colored; the open form may be differently colored):

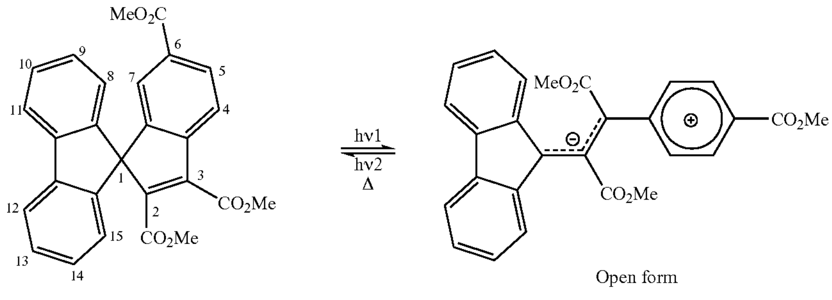

Closed form

Open form wherein one, two, three or more substituents may be optionally present at the 4, 5, 6, 7, 8, 9, 10, 11, 12 and 13 positions. Examples of substituents include (but are not limited to) alkyl, including cyclic alkyl groups, such as cyclopropyl, cyclohexyl, and the like, and including unsaturated alkyl groups, such as vinyl ($H_2C{=}CH{-}$), allyl ($H_2C{=}CH{-}CH_2{-}$), propynyl ($HC{-}C{-}CH_2{-}$), and the like, preferably with from 1 to about 50 carbon atoms and more preferably with from 1 to about 30 carbon atoms, aryl, preferably with from about 6 to about 30 carbon atoms and more preferably with from about 6 to about 20 carbon atoms, arylalkyl, preferably with from about 7 to about 50 carbon atoms and more preferably with from about 7 to about 30 carbon atoms, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 50 carbon atoms and more preferably with from 1 to about 30 carbon atoms, aryloxy groups, preferably with from about 6 to about 30 carbon atoms and more preferably with from about 6 to about 20 carbon atoms, alkylthio groups, preferably with from 1 to about 50 carbon atoms and more preferably with from 1 to about 30 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. The alkyl, aryl, and arylalkyl groups can also be substituted with groups such as, for example, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 30 carbon atoms and more preferably with from 1 to about 20 carbon atoms, aryloxy groups, preferably with from about 6 to about 30 carbon atoms and more preferably with from about 6 to about 20 carbon atoms, alkylthio groups, preferably with from 1 to about 30 carbon atoms and more preferably with from 1 to about 20 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. Further, two or more substituents can be joined together to form a ring.

Specific examples of photochromic spirodihydroindolizines include for example 4,5-dicarbomethoxy-3H-pyrazole-(3-spiro-9)-fluorene; 1'H-2',3'-6tricarbomethoxy-spiro(fluorine-9–1'-pyrrolo[1,2-b]-pyridazine]; 1' H-2',3'-dicyano-7-methoxy-carbonyl-spiro[fluorine-9,1'-pyrrolo-[1,2-b] pyridine.

Spirodihydroindolizines synthesis is described in detail for example in J. C. Crano and R. J. Guglielmetti, Organic Photochromic and Thermochromic Compounds, Vol. 1, Main Photochromic Families (Topics in Applied Chemistry), Plenum Press, New York, 1999, the disclosure of which is totally incorporated herein by reference.

Photochromic quinones of formulas (the form on the left may be colorless/weakly colored; the form on the right may be colored):

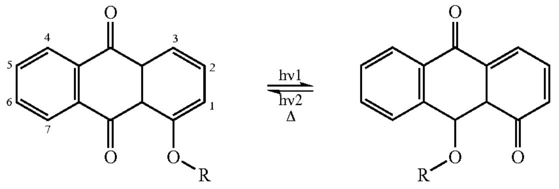

wherein one, two, three or more substituents may be optionally present at the 2, 4, 5, 6 and 7 positions. Examples of substituents and the R moiety include (but are not limited to) alkyl, including cyclic alkyl groups, such as cyclopropyl, cyclohexyl, and the like, and including unsaturated alkyl groups, such as vinyl ($H_2C{=}CH$), allyl ($H_2C{=}CH—CH_2—$), propynyl ($HC{\equiv}C—CH_2—$), and the like, preferably with from 1 to about 50 carbon atoms and more preferably with from 1 to about 30 carbon atoms, aryl, preferably with from about 6 to about 30 carbon atoms and more preferably with from about 6 to about 20 carbon atoms, arylalkyl, preferably with from about 7 to about 50 carbon atoms and more preferably with from about 7 to about 30 carbon atoms, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 50 carbon atoms and more preferably with from 1 to about 30 carbon atoms, aryloxy groups, preferably with from about 6 to about 30 carbon atoms and more preferably with from about 6 to about 20 carbon atoms, alkylthio groups, preferably with from 1 to about 50 carbon atoms and more preferably with from 1 to about 30 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. The alkyl, aryl, and arylalkyl groups can also be substituted with groups such as, for example, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 30 carbon atoms and more preferably with from 1 to about 20 carbon atoms, aryloxy groups, preferably with from about 6 to about 30 carbon atoms and more preferably with from about 6 to about 20 carbon atoms, alkylthio groups, preferably with from 1 to about 30 carbon atoms and more preferably with from 1 to about 20 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. Further, two or more substituents can be joined together to form a ring. In embodiments, the R moiety is hydrogen.

Specific examples of photochromic quinone include for example 1-phenoxy-2,4-dioxyanthraquinone; 6-phenoxy-5, 12-naphthacenequinone; 6-phenoxy-5,12-pentacenequinone; 1,3-dichloro-6-phenoxy-7,12-phthaloylpyrene.

Photochromic quinones synthesis is described in detail for example in J. C. Crano and R. J. Guglielmetti, Organic Photochromic and Thermochromic Compounds, Vol. 1, Main Photochromic Families (Topics in Applied Chemistry), Plenum Press, New York, 1999, the disclosure of which is totally incorporated herein by reference.

Perimidinespirocyclohexadienones of the following formulas are suitable as the photochromic material (the form on the left may be colorless/weakly colored; the form on the right may be differently colored):

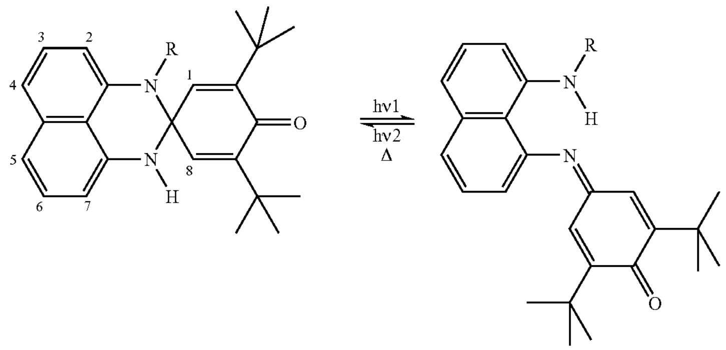

wherein one, two, three or more substituents may be optionally present at the 1, 2, 4, 5, 6, 7 and 8 positions. Examples of substituents and the R moiety include (but are not limited to) alkyl, including cyclic alkyl groups, such as cyclopropyl, cyclohexyl, and the like, and including unsaturated alkyl groups, such as vinyl ($H_2C{=}CH$), allyl ($H_2C{=}CH—CH_2—$), propynyl ($HC{\equiv}C—CH_2—$), and the like, preferably with from 1 to about 50 carbon atoms and more preferably with from 1 to about 30 carbon atoms, aryl, preferably with from about 6 to about 30 carbon atoms and more preferably with from about 6 to about 20 carbon atoms, arylalkyl, preferably with from about 7 to about 50 carbon atoms and more preferably with from about 7 to about 30 carbon atoms, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 50 carbon atoms and more preferably with from 1 to about 30 carbon atoms, aryloxy groups, preferably with from about 6 to about 30 carbon atoms and more preferably with from about 6 to about 20 carbon atoms, alkylthio groups, preferably with from 1 to about 50 carbon atoms and more preferably with from 1 to about 30 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. The alkyl, aryl, and arylalkyl groups can also be substituted with groups such as, for example, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 30 carbon atoms and more preferably with from 1 to about 20 carbon atoms, aryloxy groups, preferably with from about 6 to about 30 carbon atoms and more preferably with from about 6 to about 20 carbon atoms, alkylthio groups, preferably with from 1 to about 30 carbon atoms and more preferably with from 1 to about 20 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. Further, two or more substituents can be joined together to form a ring. In embodiments, the R moiety is hydrogen.

Specific examples of photochromic perimidinespirocyclohexadienones include for example 2,3-dihydro-2-spiro-4'-(2',6'-di-tert-butylcyclohexadien-2',5'-one)-perimidine; 1-methyl-2,3-dihydro-2-spiro-4'-(2',6'-di-tert-butylcyclohexadien-2',5'-one)-perimidine; 2,3-dihydro-2-spiro-4'-[(4H)-2'-tert-butylnaphthalen-1'-one]perimidine; 5,7,9-trimethyl-2,3-dihydro-2-spiro-4'-(2',6'-di-tert-butylcyclohexadien-2',5'-one)-pyrido-[4,3,2,d,e] quinazoline.

Photochromic perimidinespirocyclohexadienones synthesis is described in detail for example in J. C. Crano and R. J. Guglielmetti, Organic Photochromic and Thermochromic Compounds, Vol. 1, Main Photochromic Families (Topics in Applied Chemistry), Plenum Press, New York, 1999, the disclosure of which is totally incorporated herein by reference.

Photochromic viologens of the following formulas (the form on the left may be colorless/weakly colored; the form on the right may be differently colored):

wherein one, two, three or more substituents may be optionally present at the 1, 2, 3, 4, 5, 6, 7 and 8 positions. Examples of substituents and R moiety include (but are not limited to) alkyl, including cyclic alkyl groups, such as cyclopropyl, cyclohexyl, and the like, and including unsaturated alkyl groups, such as vinyl ($H_2C{=}CH{-}$), allyl ($H_2C{=}CH{-}CH_2{-}$), propynyl ($HC{\equiv}C{-}CH_2{-}$), and the like, preferably with from 1 to about 50 carbon atoms and more preferably with from 1 to about 30 carbon atoms, aryl, preferably with from about 6 to about 30 carbon atoms and more preferably with from about 6 to about 20 carbon atoms, arylalkyl, preferably with from about 7 to about 50 carbon atoms and more preferably with from about 7 to about 30 carbon atoms, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 50 carbon atoms and more preferably with from 1 to about 30 carbon atoms, aryloxy groups, preferably with from about 6 to about 30 carbon atoms and more preferably with from about 6 to about 20 carbon atoms, alkylthio groups, preferably with from 1 to about 50 carbon atoms and more preferably with from 1 to about 30 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. The alkyl, aryl, and arylalkyl groups can also be substituted with groups such as, for example, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 30 carbon atoms and more preferably with from 1 to about 20 carbon atoms, aryloxy groups, preferably with from about 6 to about 30 carbon atoms and more preferably with from about 6 to about 20 carbon atoms, alkylthio groups, preferably with from 1 to about 30 carbon atoms and more preferably with from 1 to about 20 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. Further, two or more substituents can be joined together to form a ring. In embodiments, the R moiety is hydrogen.

The X moiety can be any anion which acts as a counterion and is needed to compensate the positive charge of the bipyridinium cation. The X moiety can be for example a halogen anion like fluoride, chloride, bromide and iodide ions, tosylate, triflate and other anions.

Specific examples of photochromic viologens include for example N,N'-dimethyl-4,4'-bipyridinium dichloride; N,N'-diethyl-4,4'-bipyridinium dibromide; N-phenyl, N'-methyl-4,4,-bipyridinium dichloride and the like.

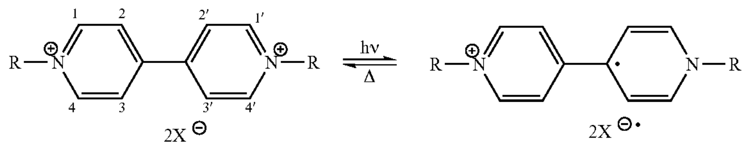

Synthesis of photochromic viologens is described in detail for example in J. C. Crano and R. J. Guglielmetti, Organic Photochromic and Thermochromic Compounds, Vol. 1, Main Photochromic Families (Topics in Applied Chemistry), Plenum Press, New York, 1999, the disclosure of which is totally incorporated herein by reference.

Fulgides and fulgimides of the following formulas are suitable as the photochromic material (the open form may be colorless/weakly colored; the closed form may be differently colored):

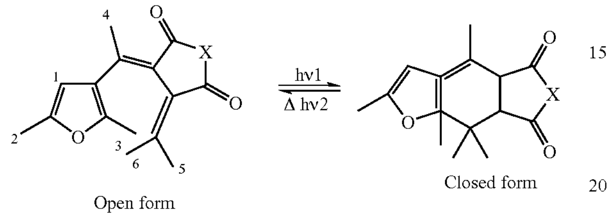

Open form Closed form

X = O (fulgides)
X = NR (fulgimides)

wherein one, two, three or more substituents may be optionally present at the 1, 2, 4, 5 and 6 positions. Examples of substituents and the R moiety include (but are not limited to) alkyl, including cyclic alkyl groups, such as cyclopropyl, cyclohexyl, and the like, and including unsaturated alkyl groups, such as vinyl ($H_2C{=}CH{-}$), allyl ($H_2C{=}CH{-}CH_2{-}$), propynyl ($HC{\equiv}C{-}CH_2{-}$), and the like, preferably with from 1 to about 50 carbon atoms and more preferably with from 1 to about 30 carbon atoms, aryl, preferably with from about 6 to about 30 carbon atoms and more preferably with from about 6 to about 20 carbon atoms, arylalkyl, preferably with from about 7 to about 50 carbon atoms and more preferably with from about 7 to about 30 carbon atoms, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 50 carbon atoms and more preferably with from 1 to about 30 carbon atoms, aryloxy groups, preferably with from about 6 to about 30 carbon atoms and more preferably with from about 6 to about 20 carbon atoms, alkylthio groups, preferably with from 1 to about 50 carbon atoms and more preferably with from 1 to about 30 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. The alkyl, aryl, and arylalkyl groups can also be substituted with groups such as, for example, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 30 carbon atoms and more preferably with from 1 to about 20 carbon atoms, aryloxy groups, preferably with from about 6 to about 30 carbon atoms and more preferably with from about 6 to about 20 carbon atoms, alkylthio groups, preferably with from 1 to about 30 carbon atoms and more preferably with from 1 to about 20 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. Further, two or more substituents can be joined together to form a ring. In embodiments, the R moiety is hydrogen.

Specific examples of fulgides include 1-(p-methoxyphenyl)-ethylidene (isopropylidene) succinic anhydride; 2-[1-(2,5-dimethyl-3-furyl)-2-methylpropylidene]-3-isopropylidene succinic anhydride; (1,2-dimethyl-4-isopropyl-5-phenyl)-3-pyrryl ethylidene (isopropylidene) succinic anhydride.

Synthesis of photochromic fulgides is described in detail for example in J. C. Crano and R. J. Guglielmetti, Organic Photochromic and Thermochromic Compounds, Vol. 1, Main Photochromic Families (Topics in Applied Chemistry), Plenum Press, New York, 1999, the disclosure of which is totally incorporated herein by reference.

Diarylethenes and related compounds of the following formulas are suitable as the photochromic material (the open form may be colorless/weakly colored; the closed form may be differently colored):

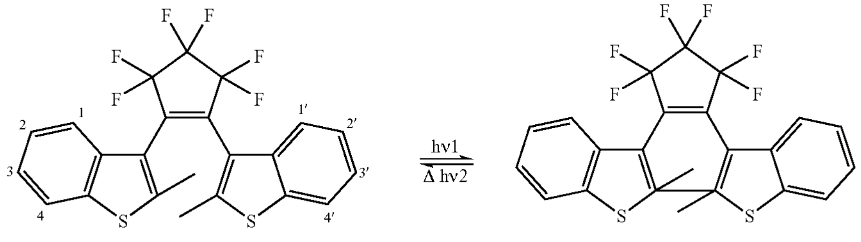

Open form Closed form wherein one, two, three or more substituents may be optionally present at the 1, 2, 3, 4, 1', 2', 3' and 4' positions. Examples of substituents include (but are not limited to) alkyl, including cyclic alkyl groups, such as cyclopropyl, cyclohexyl, and the like, and including unsaturated alkyl groups, such as vinyl ($H_2C{=}CH{-}$), allyl ($H_2C{=}CH{-}CH_2{-}$), propynyl ($HC{\equiv}C{-}CH_2{-}$), and the like, preferably with from 1 to about 50 carbon atoms and more preferably with from 1 to about 30 carbon atoms, aryl, preferably with from about 6 to about 30 carbon atoms and more preferably with from about 6 to about 20 carbon atoms, arylalkyl, preferably with from about 7 to about 50 carbon atoms and more preferably with from about 7 to about 30 carbon atoms, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 50 carbon atoms and more preferably with from 1 to about 30 carbon atoms, aryloxy groups, preferably with from about 6 to about 30 carbon atoms and more preferably with from about 6 to about 20 carbon atoms, alkylthio groups, preferably with from 1 to about 50 carbon atoms and more preferably with from 1 to about 30 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. The alkyl, aryl, and arylalkyl groups can also be substituted with groups such as, for example, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 30 carbon atoms and more preferably with from 1 to about 20 carbon atoms, aryloxy groups, preferably with from about 6 to about 30 carbon atoms and more preferably with from about 6 to about 20 carbon atoms, alkylthio groups, preferably with from 1 to about 30 carbon atoms and more preferably with from 1 to about 20 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. Further, two or more substituents can be joined together to form a ring.

Specific examples of diarylethylenes include 1,2-bis-(2, 4-dimethylthiophen-3-yl)perfluorocyclopentene; 1,2-bis-(3, 5-dimethylthiophen-3-yl) perfluorocyclopentene; 1,2-bis-(2, 4-diphenyl]thiophen-3-yl)perfluorocyclopentene.

Synthesis of photochromic diarylethenes is known and is described for example in J. C. Crano and R. J. Guglielmetti, Organic Photochromic and Thermochromic Compounds, Vol. 1, Main Photochromic Families (Topics in Applied Chemistry), Plenum Press, New York, 1999, the disclosure of which is totally incorporated herein by reference.

Triarylmethanes of the following formulas are suitable as the photochromic material (the form on the left may be colorless/weakly colored; the form on the right may be differently colored):

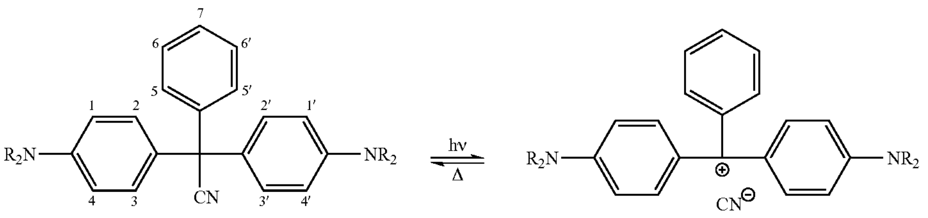

wherein one, two, three or more substituents may be optionally present at the 1, 2, 3, 4, 5, 6, 7, 1', 2', 3, 4', 5' and 6' positions. Examples of substituents and the R moiety include (but are not limited to) alkyl, including cyclic alkyl groups, such as cyclopropyl, cyclohexyl, and the like, and including unsaturated alkyl groups, such as vinyl ($H_2C{=}CH{-}$), allyl ($H_2C{=}CH{-}CH_2{-}$), propynyl ($HC{\equiv}C{-}CH_2{-}$), and the like, preferably with from 1 to about 50 carbon atoms and more preferably with from 1 to about 30 carbon atoms, aryl, preferably with from about 6 to about 30 carbon atoms and more preferably with from about 6 to about 20 carbon atoms, arylalkyl, preferably with from about 7 to about 50 carbon atoms and more preferably with from about 7 to about 30 carbon atoms, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 50 carbon atoms and more preferably with from 1 to about 30 carbon atoms, aryloxy groups, preferably with from about 6 to about 30 carbon atoms and more preferably with from about 6 to about 20 carbon atoms, alkylthio groups, preferably with from 1 to about 50 carbon atoms and more preferably with from 1 to about 30 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. The alkyl, aryl, and arylalkyl groups can also be substituted with groups such as, for example, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 30 carbon atoms and more preferably with from 1 to about 20 carbon atoms, aryloxy groups, preferably with from about 6 to about 30 carbon atoms and more preferably with from about 6 to about 20 carbon atoms, alkylthio groups, preferably with from 1 to about 30 carbon atoms and more preferably with from 1 to about 20 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. Further, two or more substituents can be joined together to form a ring. In embodiments, the R moiety is hydrogen.

Specific examples of triarylmethanes include compounds X, XI and XII.

X

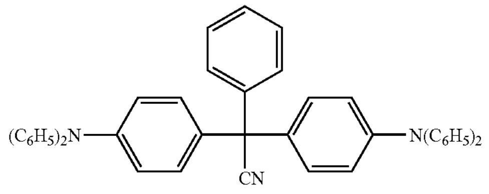

-continued

XI

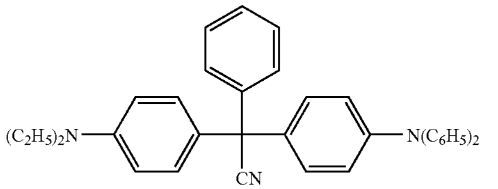

XII

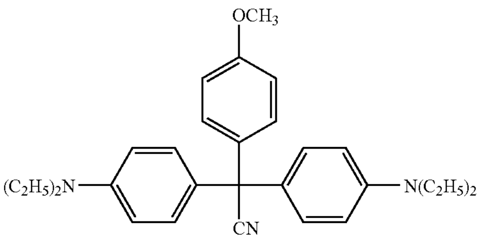

Synthesis of triarylmethanes is described for example in H. Taro, M. Kodo, Bull. Chem. Soc. Jpn., 38(12) p. 2202 (1965), the disclosure of which is totally incorporated herein by reference.

Anils and related compounds of the following formulas are suitable as the photochromic material (the form on the left may be colorless/weakly colored; the form on the right may be differently colored):

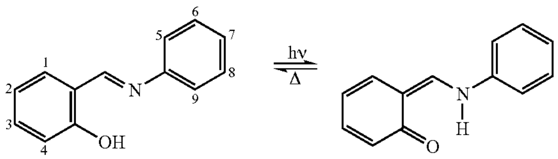

wherein one, two, three or more substituents may be optionally present at the 1, 2, 3, 4, 5, 6, 7, 8 and 9. Examples of substituents include (but are not limited to) alkyl, including cyclic alkyl groups, such as cyclopropyl, cyclohexyl, and the like, and including unsaturated alkyl groups, such as vinyl ($H_2C{=}CH{-}$), allyl ($H_2C{=}CH{-}CH_2{-}$), propynyl ($HC{\equiv}C{-}CH_2{-}$), and the like, preferably with from 1 to about 50 carbon atoms and more preferably with from 1 to about 30 carbon atoms, aryl, preferably with from about 6 to about 30 carbon atoms and more preferably with from about 6 to about 20 carbon atoms, arylalkyl, preferably with from about 7 to about 50 carbon atoms and more preferably with from about 7 to about 30 carbon atoms, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 50 carbon atoms and more preferably with from 1 to about 30 carbon atoms, aryloxy groups, preferably with from about 6 to about 30 carbon atoms and more preferably with from about 6 to about 20 carbon atoms, alkylthio groups, preferably with from 1 to about 50 carbon atoms and more preferably with from 1 to about 30 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. The alkyl, aryl, and arylalkyl groups can also be substituted with groups such as, for example, silyl groups, nitro groups, cyano groups, halide atoms, such as fluoride, chloride, bromide, iodide, and astatide, amine groups, including primary, secondary, and tertiary amines, hydroxy groups, alkoxy groups, preferably with from 1 to about 30 carbon atoms and more preferably with from 1 to about 20 carbon atoms, aryloxy groups, preferably with from about 6 to about 30 carbon atoms and more preferably with from about 6 to about 20 carbon atoms, alkylthio groups, preferably with from 1 to about 30 carbon atoms and more preferably with from 1 to about 20 carbon atoms, arylthio groups, preferably with from about 6 to about 30 carbon atoms and more preferably with from about 6 to about 20 carbon atoms, aldehyde groups, ketone groups, ester groups, amide groups, carboxylic acid groups, sulfonic acid groups, and the like. Further, two or more substituents can be joined together to form a ring.

Specific examples of anils and related compounds include molecules XIII, XIV, XV and the like.

XIII

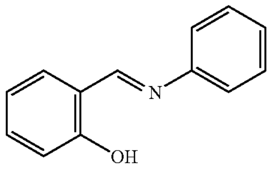

XIV

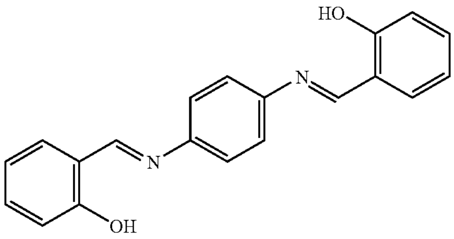

XV

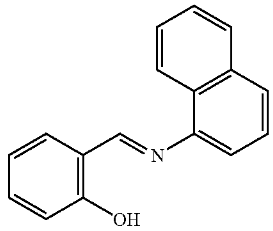

Photochromic anils are known and their synthesis has been described for example in K. Kownacki, L. Kaczmarek, A. Grabowska, Chem. Phys. Lett., 210, p. 373 (1993); M.S.M. Rawat, S. Mal, G. Pant, Current Science, 58, p. 796 (1989); P. F. Barbara, P. M., Rentzepis, L. E. Brus, J. Am. Chem. Soc., 102, p. 2786 (1980), the disclosures of which are totally incorporated herein by reference.

A binder is optionally present. The role of the binder is that of a suspending medium to hold the photochromic material as a film or layer on the substrate of interest. The desired properties of the binder are any or all of the following: mechanical flexibility, robustness, and optical clarity. In embodiments, the binder should not be highly crystalline or light scattering so that the imaging light can image the photochromic material, and the temporary images are of sufficient contrast. Moreover, in embodiments, the binder is a solid, nonvolatile material that will not be removed from the substrate.

Any suitable binder may be used such as a polymer material. Examples of polymer materials that can be used as binders include: polycarbonates, polystyrenes, polysulfones, polyethersulfones, polyarylsulfones, polyarylethers, polyolefins, polyacrylates, polyvinyl derivatives, cellulose derivatives, polyurethanes, polyamides, polyimides, polyesters, silicone resins, and epoxy resins and the like. Copolymer materials such as polystyrene-acrylonitrile, polyethylene-acrylate, vinylidenechloride-vinylchloride, vinylacetate-vinylidene chloride, styrene-alkyd resins are also examples of suitable binder materials. The copolymers may be block, random, or alternating copolymers.

Examples of polycarbonates as the binder include: poly (bisphenol-A-carbonate) and polyethercarbonates obtained from the condensation of N,N'-diphenyl-N,N'-bis(3-hydroxy phenyl)-[1,1'-biphenyl]-4,4'-diamine and diethylene glycol bischloroformate.

Examples of polystyrenes as the binder include: polystyrene, poly (bromostyrene), poly(chlorostyrene), poly(methoxystyrene), poly(methylstyrene).

Examples of polyolefins as the binder include: polychloroprene, polyethylene, poly(ethylene oxide), polypropylene, polybutadiene, polyisobutylene, polyisoprene, and copolymers of ethylene, including poly(ethylene/acrylic acid), poly (ethylene/ethyl acrylate), poly(ethylene/methacrylic acid), poly(ethylene/propylene), poly(ethylene/vinyl acetate), poly (ethylene/vinyl alcohol), poly(ethylene/maleic anhydride).

Examples of polyacrylates as the binder include: poly (methyl methyacrylate), poly(cyclohexyl methacrylate), poly(n-butyl methacrylate), poly(sec-butyl methacrylate), poly(iso-butyl methacrylate), poly(tert-butyl methyacrylate), poly (n-hexyl methacrylate), poly(n-decyl methacrylate), poly(lauryl methacrylate), poly (hexadecyl methacrylate), poly(isobornyl methacrylate), poly(isopropyl methacrylate), poly(isodecyl methacrylate), poly(isooctyl methacrylate), poly(noeopentyl methacrylate), poly(octadecylmethacrylate), poly(octyl methacrylate), poly(n-propyl methacrylate), poly(phenyl methacrylate), poly(n-tridecyl methacrylate), as well as the corresponding acrylate polymers. Other examples include: poly(acrylamide), poly (acrylic acid), poly(acrylonitrile), poly(benzylacrylate), poly (benzylmethacrylate), poly (2-ethylhexyl acrylate), poly(triethylene glycol dimethacrylate). Commercial examples of these materials include acrylic and methacrylic ester polymers such as ACRYLOID™ A10 and ACRYLOID™ B72, polymerized ester derivatives of acrylic and alpha-acrylic acids both supplied by the Rohm and Haas Company, and LUCITE™ 44, LUCITE™ 45 and LUCITE™ 46 polymerized butyl methacrylates supplied by the Du Pont Company.

Examples of polyvinyl derivatives as the binder include: poly (vinyl alcohol), poly(vinyl acetate), poly(vinyl chloride), poly(vinyl butyral), poly (vinyl fluoride), poly(vinyl pyridine), poly(vinyl pyrrolidone), poly(vinyl stearate). Commercially available polyvinyl derivatives include chlorinated rubber such as PARLON™ supplied by the Hercules Powder Company; copolymers of polyvinyl chloride and polyvinyl acetate such as Vinylite VYHH and VMCH manufactured by the Bakelite Corporation; alkyd resins such as GLYPTAL™ 2469 manufactured by the General Electric Co.

Examples of cellulose derivatives as the binder include: cellulose, cellulose acetate, cellulose acetate butyrate, cellulose propionate, cellulose triacetate, ethyl cellulose, hydroxypropyl cellulose, methyl cellulose.

Examples of polyurethanes as the binder include aliphatic and aromatic polyurethanes like NEOREZ™ 966, NEOREZ™ R-9320 and the like, manufactured by NeoResins Inc., copolymers of polyurethanes with polyethers and polycarbonates like THECOTHANE®, CARBOTHANE®, TECHOPHYLIC® manufactured by Thermadics in Wilmington, Mass. (USA), BAYDUR® and BAYFIT®, BAYFLEX® and BAYTEC® polyurethane polymers manufactured by Bayer.

Examples of polyamides as the binder include: Nylon 6, Nylon 66, TACTEL™ which is a registered mark of DuPont, modified polyamides like ARLEN™ from Mitsui Chemicals and TORLON®.

Examples of polyesters as the binder include: poly(ethylene terepthalate), poly(ethylene napthalate) and the like.

Examples of silicone resins as the binder include: polydimethylsiloxane, DC-801, DC804, and DC-996, all manufactured by the Dow Corning Corp. and SR-82, manufactured by GE Silicones. Other examples of silicone resins include copolymers such as silicone polycarbonates, that can be cast into films from solutions in methylene chloride. Such copolymers are disclosed in U.S. Pat. No. 3,994,988. Other examples of silicone resins include siloxane modified acrylate and methacrylate copolymers described in U.S. Pat. Nos. 3,878,263 and 3,663,650. Methacryl silanes such as COATOSIL® 1757 silane, SILQUEST®A-174NT, SILQUEST®A-178, and SILQUEST®Y-9936 and vinyl silane materials such as COATOSIL® 1706, SILQUEST® A-171, and SILQUEST®A-151 all manufactured by GE-Silicones. Also, solvent-based silicone coatings such as UVHC3000, UVHC8558, and UVHC8559, also manufactured by GE-Silicones. Aminofunctional silicones may be combined with other polymers to create polyurethanes and polyimides. Examples of aminofunctional silicones include DMS-A11, DMS-A12, DMS-A15, DMS-A21, and DMS-A32, manufactured by Gelest Inc. Silicone films can also be prepared via RTV addition cure of vinyl terminated polydimethylsiloxanes, as described by Gelect Inc. The following formulation may be used:

DMS-V31 1000 cSt vinyl terminated polydimethylsiloxane—100 parts;

SIS6962.0 hexamethyldisilazane treated silica—50 parts;

MHS-301 methylhydrosiloxane-dimethylsiloxane copolymer—3 to 4 parts; and

SIP6830.0 platinum complex solution—150 to 200 ppm.

Another example of silicone-based coating binders is a cured elastomer derived from the SYLGARD® line of silicone materials. Examples of such materials include SYLGARD® 182 SYLGARD® 184 and SYLGARD® 186, available from Dow Corning.

Examples of epoxy resins as the binder include: cycloaliphatic epoxy resins and modified epoxy resins like for example Uvacure 1500 series manufactured by Radcure Inc.; bisphenol-A based epoxy resins like for example D.E.R. 661, D.E.R. 671 and D.E.R. 692H all available at Dow Corning Company. Other examples include aromatic epoxy acrylates like LAROMER™ EA81, LAROMER™ LR 8713 and LAROMER™ LR9019, modified aromatic epoxy acrylate like LAROMER™ LR 9023, all commercially available at BASF.

The binder may be composed of one, two, three or more different binders. When two or more different binders are present, each binder may be present in an equal or unequal amount by weight ranging for example from about 5% to 90%, particularly from about 30% to about 50%, based on the weight of all binders.

A light absorbing material is optionally present and may be composed of one, two or more light absorbing materials. To explain the purpose of the light absorbing material, one first considers that the photochromic material is capable of reversibly converting among a number of different forms, wherein one form has an absorption spectrum that overlaps with the predetermined wavelength scope. The light absorbing material exhibits a light absorption band with an absorption peak, wherein the light absorption band overlaps with the absorption spectrum of the one form of the photochromic material. The phrase "absorption spectrum" refers to light absorption at a range of wavelengths where the light absorption is greater than a minimal amount. Within the absorption spectrum, there is at least one "light absorption band." The phrase "light absorption band" refers to a range of wavelengths where the absorption is at a relatively high level, typically including an absorption peak where the absorption is at the maximum amount for that "light absorption band." The light absorbing material is selected based on its absorption spectrum compared with the absorption spectrum of the one form of the photochromic material. The one form of the photochromic material that is compared with the optional light absorbing material can be any form of the photochromic material based on for example color or thermodynamic stability. In embodiments, the absorption spectrum of the light absorbing material is compared to the absorption spectrum of the more thermodynamically stable form of the photochromic material where for the exemplary reversibly interconvertible forms of spiropyran and merocyanine, spiropyran is considered the more thermodynamically stable form. The phrase "thermodynamically stable form" refers to the compound which is more stable in the absence of external stimuli. For example, a mixture of spiropyran and its corresponding merocyanine of any ratio between the two forms will evolve to 100% spiropyran if given enough time and the mixture is not exposed to stimuli like light. Spiropyran (closed form) is the more thermodynamically stable form.

FIG. 1 illustrates the meaning of "absorption spectrum," "light absorption band," and "absorption peak" for spiropyran (one form of the photochromic material), a yellow dye (first light absorbing material), and azobenzene (second light absorbing material). Spiropyran exhibits an "absorption spectrum" ranging from 250 nm to about 400 nm; any minimal absorption of spiropyran from about 400 nm to 500 nm is not considered part of the "absorption spectrum." Within the absorption spectrum of spiropyran, there are two overlapping light absorption bands, a first light absorption band ranging from 250 nm to about 310 nm, and a second light absorption band ranging from about 310 nm to about 400 nm. The first light absorption band of spiropyran has an absorption peak at about 270 nm; the second light absorption band of spiropyran has an absorption peak at about 340 nm. In the embodiment where the imaging light has a predetermined wavelength scope of 365 nm, spiropyran has an absorption spectrum that overlaps with the predetermined wavelength scope as seen in FIG. 1. In embodiments, the light absorption band of the one form of the photochromic material overlaps with the predetermined wavelength scope which is illustrated in FIG. 1 where the second light absorption band of spiropyran overlaps with the predetermined wavelength scope of 365 nm.

Yellow dye has two non-overlapping light absorption bands, a first light absorption band ranging from 250 nm to about 295 nm, and a second light absorption band ranging from about 370 nm to about 480 nm. The first light absorption band of yellow dye has an absorption peak at about 270 nm; the second light absorption band of yellow dye has an absorption peak at about 430 nm. The yellow dye in FIG. 1 is menthyl anthranilate dodecyl pyridone, the structure of which is depicted herein.

Azobenzene has a light absorption band ranging from about 250 nm to about 360 nm with an absorption peak at about 320 nm.

In embodiments, the absorption peak of the light absorbing material avoids overlap with the predetermined wavelength scope. This is illustrated in FIG. 1 where the two light absorption bands and their absorption peaks of the yellow dye, and the light absorption band and its absorption peak of azobenzene overlap avoid with the predetermined wavelength scope of 365 nm.

The procedure for generating FIG. 1 is now described. Three film samples were prepared by spin coating procedure of solutions containing yellow dye, spiropyran and azobenzene respectively, each of them dissolved in a 2.5 ml solution of polymethylmethacrylate in tetrahydrofuran. Each sample contained one of the above mentioned yellow dye, spiropyran and azobenzene, in an amount comprised from 20 mg to 50 mg. UV-VIS spectra of the films on quartz substrates were recorded with an UV-VIS spectrophotometer. The recorded absorption spectra are shown together in FIG. 1. It is understood that the values for light absorption may vary with material concentration. But in general the wavelength regions corresponding to "absorption spectrum," "light absorption band," and "absorption peak" is independent of material concentration.

In embodiments, the light absorption band of the light absorbing material overlaps with an absorption peak of the one form of the photochromic material. This is illustrated in FIG. 1 where the light absorption band of azobenzene overlaps with the absorption peak (about 340 nm) of the second light absorption band of spiropyran.

The light absorbing material may have any suitable absorption spectrum, light absorption band(s), and absorption peak(s). The following exemplary embodiments are now described in the context of a graph depicting absorption versus light wavelength: (1) the light absorbing material has a light absorption band with an absorption peak, where the entire light absorption band or just the absorption peak is below the predetermined wavelength scope; (2) the light absorbing material has a light absorption band with an absorption peak, where the entire light absorption band or just the absorption peak is above the predetermined wavelength scope; and (3) the light absorbing material has at least two light absorption bands, each with an absorption peak, where the entire first light absorption band or just the absorption peak of the first light absorption band is below the predetermined wavelength scope and the entire second light absorption band or just the absorption peak of the second light absorption band is above the predetermined wavelength scope.

This third embodiment, as seen in FIG. 1, can create a "light band-pass window" centered around the predetermined wavelength scope of the imaging light, e.g., about 365 nm, where the light absorbing material exhibits stronger absorption at the wavelengths both above and below the predetermined wavelength scope and weaker or minimal absorption at the predetermined wavelength scope of the imaging light.

In the absence of the light absorbing material, indoor ambient light over a period of time may cause in embodiments the photochromic material in the non-exposed region (that is, not exposed to the imaging light) to undergo the interconversion to the different form where the color of the non-exposed region may match or be similar to the color of the exposed region, thereby causing fading or erasure of the temporary image by the reduction in the color contrast.

Incorporating the light absorbing material into the reimageable medium reduces or minimizes this problem.

Any suitable light absorbing materials can be used. Organic molecules and polymeric materials useful for the light absorbing material, a number of which possess high absorbance below the predetermined wavelength scope, are now described.

Organic compounds which may be useful for the light absorbing material include 2-hydroxy-phenones, like for example 2,4-diyhdroxyphenone, 2-(2-hydroxy-5-tert-octylphenyl)benzotriazole, 2-hydroxy-4-n-octoxybenzophenone, 2-(2'-hydroxy-3', 5'-di-tert-amylphenyl)benzotriazole, azobenzene derivatives like for example azobenzene, 4-ethyl azobenzene, 2-chloro-azobenzene, 4-phenylazobenzene, aromatic conjugated systems possessing:

(a) at least one aromatic ring such as one, two or more aromatic rings having for instance from about 6 carbon atoms to about 40 carbon atoms such as $—C_6H_4—$, and $—C_6H_4—C_6H_4—$;

(b) at least one aromatic ring such as one, two or more aromatic rings conjugated through one or more ethenyl or ethynyl bonds having for instance from about 8 carbon atoms to about 50 carbon atoms such as $—C_6H_4—CH{=}CH—C_6H_4—$, and $—C_6H_4—C{\equiv}C—C_6H_4—$; or (c) fused aromatic rings having for instance from about 10 to about 50 carbon atoms such as $1,4—C_{10}H_6$ and $1,5—C_{10}H_6$.

Optionally, one or more aromatic rings possess substituents. Such substituents can be for example atoms like N, O, S, where the valence of the atom is satisfied by bonding with H or a hydrocarbon group, aldehyde (—C(O)—H), ketone (—C(O)—R), ester (—COOR), a carboxylic acid (—COOH); cyano (CN); nitro ($NO_2$); nitroso (N═O); a sulfur-based group (e.g., $—SO_2—CH_3$; and $—SO_2—CF_3$); a fluorine atom; an alkene ($—CH{=}CR_2$ or —CH═CHR), wherein each R independently may be for example a straight chain alkyl group having for example 1 to about 20 carbon atoms, particularly 1 to about 12 carbon atoms, such as pentyl, decyl and dodecyl, a branched alkyl group having for example 3 to about 40 carbon atoms, particularly 3 to about 30 carbon atoms such as isopropyl, isopentyl and 2-propylpentyl, a cycloalkyl group having for example 3 to about 30 carbon atoms, particularly 4 to 7 carbon atoms in the cycle, such as cyclopentyl and cyclohexyl, an arylalkyl group or alkylaryl group having for example 7 to about 30 carbon atoms such as p-methyl-benzyl, 3-(p-ethyl-phenyl)-propyl and 5-(1-naphthyl)-pentyl.

Specific examples of organic aromatic conjugated compounds, a number of which may absorb below the predetermined wavelength scope, include for example nitro-benzene, 4-methoxy-benzonitrile, anthracene, anthraquinone, 1-chloro-anthracene and the like.

Some of these light absorbing materials are commercially available for example at Mayzo (BLS® 531; BLS® 5411; BLS® 1710), Ciba (TINUV®234, TINUV® P, TINUV® 1577) and are typically used as UV protective layer to prevent photochemical degradation of polymeric coatings.

Yellow colorants, particularly yellow dyes, useful for the light absorbing material may in embodiments possess strong absorption above the predetermined wavelength scope, along with weak or minimal absorption at the predetermined wavelength scope. The yellow colorant may optionally possess a light absorption band below the predetermined wavelength scope; in this embodiment, the amount of a second light absorbing material absorbing below the predetermined wavelength scope may be decreased or completely eliminated. Azo pyridone yellow dyes, as disclosed in U.S. Pat. Nos. 6,673,139; 6,663,703; 6,646,101; and 6,590,082 may be suitable, the disclosures of which are totally incorporated herein by reference. The azo pyridone yellow dyes may possess in embodiments very low absorption below 370 nm but high absorption above this wavelength. These azo pyridone yellow dyes can be comprised of either mono-pyridone and mono-anthranilate; dipyridone and bis anthranilate; or dianthranilate and bis-pyridone. Some examples follow:

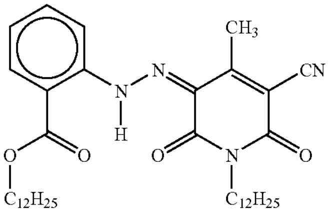

Dodecyl Anthranilate Dodecyl pyridone

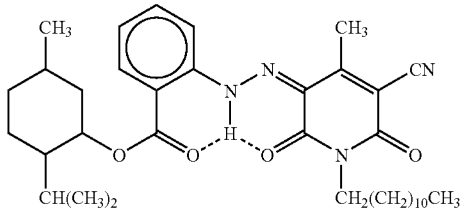

Menthyl Anthranilate Dodecyl Pyridone

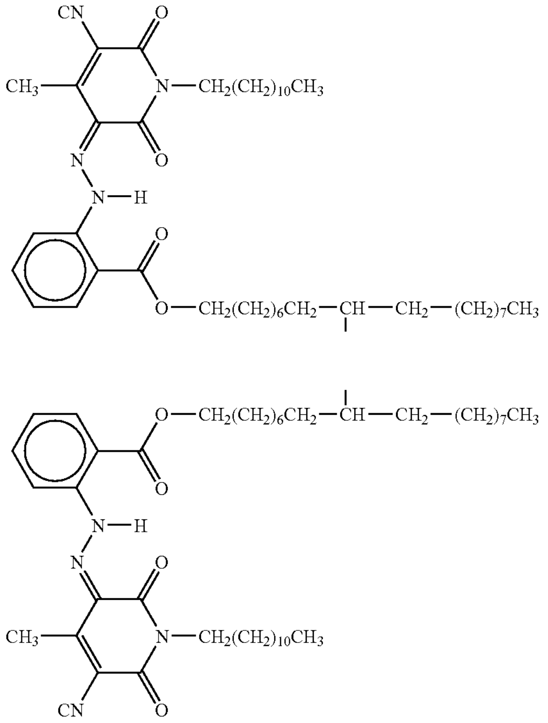

Dimer Diol Dianthranilate Bis(Dodecyl Pyridone)

-continued

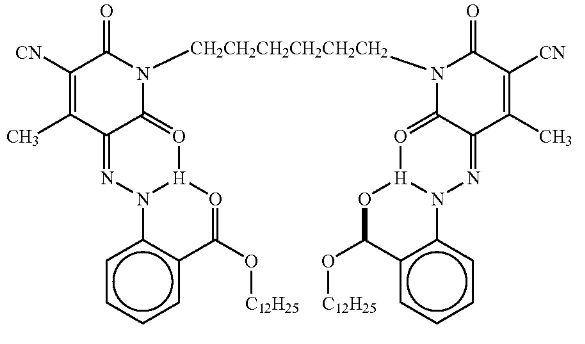

Bis(Dodecyl Anthranilate) Hexamethylene Dipyridone

In embodiments, a polymeric light absorbing material is used which is composed of an organic moiety (derived from the compounds described herein as being suitable as a light absorbing material) attached to a polymeric backbone. The organic moiety (e.g., azobenzene moiety and azo pyridone moiety) can be part of the polymer backbone of the polymer or the organic moiety can be attached as a side group to the polymer backbone. Suitable examples of the polymeric light absorbing material include substituted polystyrenes, substituted acrylates, substituted methacrylates, substituted polyurethanes, all containing attached or inserted organic moieties as described for the light absorbing organic molecules.

The light absorbing material may be composed of one, two, three or more different light absorbing materials. When two or more different light absorbing materials are present, each light absorbing material may be present in an equal or unequal amount by weight ranging for example from about 5% to 90%, particularly from about 30% to about 50%, based on the weight of all light absorbing materials. The light absorbing material may be in the form of a separate layer over the photochromic material. In another embodiment, the light absorbing material and the photochromic material form a single layer over the substrate. In a further embodiment, the light absorbing material and the photochromic material are both impregnated or embedded into a porous substrate such as paper. When the light absorbing material is present in a separate layer, a binder (as described herein) is optionally used with the light absorbing material in the separate layer where the binder and the light absorbing material are each present in an equal or unequal amount by weight, each ranging for example from about 5% to 90% by weight, particularly from about 30% to about 50% by weight, based on the weight of the binder and the light absorbing material.

A solvent is used to dissolve the photochromic material, the optional binder, and the optional light absorbing material to enable processing to create for example a uniform film coating on the substrate. In embodiments, the solvent is volatile enough so that it can be conveniently removed during drying. Water may be used as a solvent for water soluble binders such as poly(vinyl alcohol) and water soluble photochromic and light absorbing materials. Other solvents that may be used include halogenated and nonhalogenated solvents, such as tetrahydrofuran, trichloro- and tetrachloroethane, dichloromethane, chloroform, monochlorobenzene, toluene, xylenes, acetone, methanol, ethanol, xylenes, benzene, ethyl acetate and the like. The solvent may be composed of one, two, three or more different solvents. When two or more different solvents are present, each solvent may be present in an equal or unequal amount by weight ranging for example from about 5% to 90%, particularly from about 30% to about 50%, based on the weight of all solvents.

Solutions are prepared by for example dissolving photochromic material into a solution containing polymeric binder dissolved in a suitable solvent. When light absorbing material is used, this may be dissolved at the same time with the photochromic material. Preparation of the solution containing the polymeric binder may require in some cases heating in order to ensure complete dissolution of the polymeric binder. In some cases, particularly for dimeric or polymeric yellow colorants, it may be necessary to heat in order to ensure complete dissolution of the yellow colorant.

Embodiments of the solution contain the following components in exemplary proportions (all percentages are based on weight of the solution):

photochromic material: about 0.01% to about 50%, particularly about 1% to about 10%; and solvent: about 50% to about 90%, particularly about 20% to about 50%.

Further embodiments of the solution contain the following components in exemplary proportions (all percentages are based on weight of the solution):

photochromic material: about 0.01% to about 50%, particularly about 1% to about 10%;

binder: about 10% to about 30%, particularly about 20% to about 30%; and solvent: about 50% to about 90%, particularly about 20% to about 50%.

Additional embodiments of the solution contain the following components in exemplary proportions (all percentages are based on weight of the solution):

photochromic material: about 0.01% to about 50%, particularly about 1% to about 10%;

binder: about 10% to about 30%, particularly about 20% to about 30%;

light absorbing material: about 1% to about 30%, particularly about 10% to about 30%; and solvent: about 50% to about 90%, particularly about 20% to about 50%.

In embodiments, the substrate is made of a flexible material. The substrate can be transparent or opaque. The substrate may be composed of any suitable material such as wood, plastics, paper, fabrics, textile products, polymeric films, inorganic substrates such as metals, and the like. The plastic may be for example a plastic film, such as polyethylene film, polyethylene terepthalate, polyethylene napthalate, polystyrene, polycarbonate, polyethersulfone. The paper may be for example plain papers such as XEROX® 4024 papers, ruled notebook paper, bond paper, silica coated papers such as Sharp Company silica coated paper, Jujo paper, and the like. The substrate may be a single layer or multi-layer where each layer is the same or different material. The substrate has a thickness ranging for example from about 0.3 mm to about 5 mm.

In embodiments, the substrate (and reimageable medium) has any number of sides such as two (e.g., a sheet of paper), three, four or more sides (e.g., a cube). When one is trying to determine the number of sides of the substrate/medium, it is helpful to consider the intended use of the medium. For example, where the substrate/medium has the configuration of a folder (of the kind for holding loose papers) but the folder is laid relatively flat when viewing the temporary image which stretches across the entire viewing surface, the substrate/medium can be thought of as having two sides (front and back sides). In embodiments, the side can have a curved shape. It is understood that the number of reimageable sides of the medium may be the same as or fewer than the number of sides of the substrate; for example, where the substrate is a sheet of paper and the photochromic material is present only on one side of the paper, then the reimageable medium has only one reimageable side even though the substrate is two-sided.

In embodiments, the substrate has a light color, particularly a white color, on any number of sides such as on one side or on two sides or on all sides.

The substrate/reimageable medium may be rigid or flexible. In fact, the substrate/reimageable medium may have any suitable rigidity or flexibility depending on the intended use for the reimageable medium. In embodiments, the substrate/reimageable medium is capable of undergoing a number of cycles of being rolled up/folded and then unrolled/unfolded. The substrate/reimageable medium has any suitable size such as the dimensions of a business card, the dimensions of a sheet of paper (e.g., A4 and letter sized), or larger, and the like. The substrate/reimageable medium may have any suitable shape such as planar (e.g., a sheet) or non-planar (e.g., cube, scroll, and a curved shape). In embodiments, a plurality of reimageable mediums can also be combined to form a larger reimageable surface analogous to a giant display screen composed of a number of smaller display screens.

The reimageable medium optionally includes a protective material which may reduce chemical degradation of the components of the reimageable medium due to exposure to ambient conditions, especially any chemical reaction involving the photochromic material and oxygen. In embodiments, the protective material may also reduce physical deterioration of the reimageable medium due to for example handling/scratching. The protective material may be a transparent resin including for example polyvinyl alcohol, polycarbonate, or acrylic resin, or a mixture thereof. The protective material may be in the form of a separate layer over the photochromic material. In another embodiment, the protective material and the photochromic material form a single layer over the substrate. In a further embodiment, the protective material and the photochromic material are both impregnated or embedded into a porous substrate such as paper.

In embodiments where both a protective material and a light absorbing material are present in the reimageable medium, the protective material and the light absorbing material may be present in the same or different layer. If present in different layers, the protective material may be located over the light absorbing material or vice versa.

Exemplary configurations of the reimageable medium include the following in the recited sequence from top to bottom (for each layer, a number of illustrative components is recited with illustrative amounts):

Configuration 1 (Two-Sided Reimageable Medium):

optional top layer (100% by weight protective material but if includes an optional light absorbing material then about 20% to about 80% by weight protective material/about 80% to about 20% by weight light absorbing material based on weight of top layer);

porous two-sided substrate impregnated or embedded with photochromic material and optional binder such that the photochromic material is present on both sides of the porous substrate to create a two-sided reimageable medium (100% by weight photochromic material but if includes an optional binder then about 20% to about 80% by weight photochromic material/about 80% to about 20% by weight binder based on weight of binder and photochromic material);

optional bottom layer (100% by weight protective material but if includes an optional light absorbing material then about 20% to about 80% by weight protective material/about 80% to about 20% by weight light absorbing material based on weight of bottom layer).

Configuration 2 (Two-Sided Reimageable Medium):

optional top layer (protective material);

first light sensitive layer (100% by weight photochromic material but if includes optional binder, and optional light absorbing material then about 20% to about 80% by weight photochromic material/about 20% to about 80% by weight binder/about 20% to about 80% by weight light absorbing material based on weight of this layer);

substrate;

second light sensitive layer (100% by weight photochromic material but if includes optional binder, and optional light absorbing material then about 20% to about 80% by weight photochromic material/about 20% to about 80% by weight binder/about 20% to about 80% by weight light absorbing material based on weight of this layer);

optional bottom layer (protective material).

Configuration 3 (One-Sided Reimageable Medium):

optional top layer (protective material);

optional intermediate layer (100% by weight light absorbing material but if includes an optional binder then about 20% to about 80% by weight light absorbing material/about 80% to about 20% by weight binder based on weight of this layer);

light sensitive layer (100% by weight photochromic material but if includes an optional binder then about 20% to about 80% by weight photochromic material/about 80% to about 20% by weight binder based on weight of this layer);

substrate.

For any reimageable side of the medium, the entire side or only a portion of the side is reimageable.

Where there are two or more layers in the reimageable medium, each of the layers may be the same or different from the other. For example, where there are a top layer (protective material) and a bottom layer (protective material), the two layers may be the same; alternatively, the top and bottom layers may differ in one or more respects such as the particular protective material used, the layer thickness, and the ratio of the different materials (in the embodiments where each layer includes a mixture of two or more different protective materials).

In the configurations described herein, each layer (e.g., top layer, intermediate layer, light sensitive layer, and bottom layer) may have a dry thickness of any suitable value ranging for example from about 1 micrometer to about 100 micrometers, particularly from about 2 micrometer to about 50 micrometers.

Any suitable techniques may be used to form the reimageable medium. For example, to deposit the components described herein, typical coating techniques include, but are not limited to, vacuum deposition, spin coating, dip coating, spray coating, draw bar coating, doctor blade coating, slot coating, roll coating and the like. After deposition, solvent can be removed by drying for a time ranging for example from about 5 minutes to about 20 hours. Drying of the deposited coating can be effected by any suitable drying techniques or a combination of them. Suitable drying techniques include air drying, air impingement drying, oven drying, infra-red radiation drying and the like.

In embodiments of the present reimageable medium, the reimageable medium is capable of any suitable number of cycles of temporary image formation and temporary image erasure ranging for example from about 5 cycles to about 1,000 cycles, or from about 10 cycles to about 100 cycles, without significant chemical degradation of the photochromic material and the other components. In embodiments of the present method, after undergoing the initial cycle of temporary image formation and temporary image erasure, the reimageable medium optionally undergoes a number of additional cycles of temporary image formation and temporary image erasure ranging from 1 additional cycle to about 1,000 additional cycles, or from 3 additional cycles to about 100 additional cycles. When there is a plurality of cycles of temporary image formation and temporary image erasure, each temporary image may be the same or different from each other, and each temporary image may be present on the same or different region of the reimageable medium.

The medium has a characteristic that when the temporary image is exposed to an indoor ambient condition for an image erasing time, the color contrast changes to the absence of the color contrast to erase the temporary image in all of the following: (i) when the indoor ambient condition includes darkness at ambient temperature, (ii) when the indoor ambient condition includes indoor ambient light at ambient temperature, and (iii) when the indoor ambient condition includes both the darkness at ambient temperature and the indoor ambient light at ambient temperature.

In embodiments, the medium has an additional characteristic that the color contrast changes to the absence of the color contrast to erase the temporary image in the following: (iv) when the medium is exposed to an elevated temperature generated by an image erasure device.

In embodiments, the medium has another characteristic that the color contrast changes to the absence of the color contrast to erase the temporary image in the following: (v) when the medium is exposed to an image erasure light generated by an image erasure device.

In embodiments of the present method, it is optional to use an image erasure device. However, other aspects of the present invention also include the reimageable medium itself and the reimageable medium in embodiments may optionally have characteristics as described herein that allow it to be used with an image erasure device. The optional image erasure device may be any suitable device that causes erasure of the temporary image by inducing a portion of the photochromic material to change to a different form having a different color (such as from purple to yellow, or from purple to colorless where colorless is considered a color in this context). The image erasure device may be for example a heating device capable of generating an elevated temperature (any suitable temperature above the ambient temperature) ranging for example from about 50 degrees C. to about 200 C. such as for example an oven or a hot air blower device. The optional image erasure device may be an artificial light source which generates an image erasure light having a broad band, a narrow band, or a single wavelength within a wavelength range of for example about 200 nm to about 700 nm. The image erasure device may be operated for any effective time period such as a time period ranging for example from about 10 seconds to about 1 hour, or from about 30 seconds to about 30 minutes.

The following discussion of general operational principles (involving exemplary embodiments) provides further information on various aspects of the present invention. For simplicity of discussion, the photochromic material is composed of only one type. In embodiments, a side of the reimageable medium may initially have the same color where the molecules of the photochromic material are all of the same first form. The imaging light directed towards a selected region of the reimageable medium causes the photochromic material in the exposed region to change to a different second form which has a different color. There then exists a color contrast between the exposed region and the non-exposed region to allow a temporary image to be visible to an observer. It is noted that the color of the exposed region and the color of the non-exposed region seen by the observer may be a combination of a number of colors including for example the color of the substrate, the color of the photochromic material in that region, and the color of any other optional component. Where the first form of the photochromic material is colorless, then the color of the non-exposed region may be primarily determined by the color of the substrate. When the temporary image erases on its own under an indoor ambient condition, the interconversion of the second form of the photochromic material to the first form in the exposed region may be due to thermal absorption (ambient temperature), or to light absorption (indoor ambient light), or to a combination thereof. It is understood that the indoor ambient conditions of indoor ambient light (at ambient temperature) and darkness (at ambient temperature) can be combined in the context that they can be used sequentially in any order.

The invention will now be described in detail with respect to specific exemplary embodiments thereof, it being understood that these examples are intended to be illustrative only and the invention is not intended to be limited to the materials, conditions, or process parameters recited herein. All percentages and parts are by weight unless otherwise indicated. As used herein, “THF” refers to tetrahydrofuran and “PMMA” refers to polymethyl methacrylate. All examples were conducted at ambient temperature unless otherwise noted. In the examples, a mask having text (transparent areas) and black areas was used for imaging the reimageable medium. The transparent areas (letters of the text) will produce text (colored) after exposure to the UV imaging light.

EXAMPLE 1

A solution was prepared by dissolving 7.5 g of polymeric binder (polymethyl methacrylate, Mw=33,000) and 0.9 g of a 1',3'-dihydro-1',3',3'-trimethyl-6-nitrospiro-(2H-1-benzopyran-2,2'-(2H)-indole (photochromic material) in a mixture of solvents made of 20 ml THF and 10 ml toluene. After dissolution, a solid film was prepared by doctor-blade on a flexible MYLAR™ sheet. Film thickness was about 10 microns. The film was dried at ambient temperature for 3 hours then in the oven for 30 minutes to ensure solvent removal. The film was protected by laminating with a second sheet of MYLAR™ plastic placed on top of it, to prevent degradation from scratching, then the bottom of the display was painted white. The reimageable medium was written by illumination with UV light (365 nm) of intensity of about 4 $mW/cm^2$ through a mask containing the negative of the image to be shown. After writing, the temporary image was visible for about 4 hours. After leaving the reimageable medium under an indoor ambient condition overnight (a total of 16 hours which included the about 4 hours that the temporary image was visible), the temporary image faded completely, so that the reimageable medium was ready to be re-imaged.

Reflection spectrophotometry was measured on the reimageable medium containing the temporary image and the following results were obtained:

Optical density (OD) colored=1.32 (reflectivity=5%);

OD white=0.21 (reflectivity=62%; and

ΔOD=1.11 (Contrast Ratio=12.4). Contrast Ratio (CR) is defined as White reflectance/Colored reflectance.

EXAMPLE 2

Regular white paper (XEROX™ multipurpose 1524 paper) was soaked into a solution containing 7.5 g of polymeric binder (polymethyl methacrylate, Mw=33,000) and 0.9 g of 1',3'-dihydro-1',3',3'-trimethyl-6-nitrospiro-(2H-1-benzopyran-2,2'-(2H)-indole (photochromic material) in 80 ml of THF. After dipping, the paper sheet was air dried, yielding a dry sheet of paper impregnated with the photochromic material. The paper was imaged by illumination with UV light (365 nm; 2.5 mW/$cm^2$) through a mask. The temporary image was visible for about 4 hours. After leaving the reimageable medium under an indoor ambient condition for about 16–20 hours (this total included the about 4 hours that the temporary image was visible), the temporary image faded completely, so that the reimageable medium was ready to be re-imaged. About 20 cycles of temporary image formation/temporary image erasure were performed on the same sheet of paper.

EXAMPLE 3

A stock polymeric solution was prepared by dissolving 15 g of PMMA 33K in 40 ml THF and 20 ml Toluene. A first sample (sample #1) was made by spin-coating on a quartz slide of a solution containing 100 mg of spiropyran (1',3'-dihydro-1',3',3'-trimethyl-6-nitrospiro-(2H-1-benzopyran-2,2'-(2H)-indole) and 100 mg of azobenzene (UV light absorbing material) dissolved into 5 ml stock polymeric solution. A comparison sample (sample #2) was made in the same way from a solution containing 100 mg spiropyran dissolved in 5 ml of the above polymeric solution (no light absorbing material added).

Sample #1 (containing spiropyran with UV light absorbing material) and sample #2 (containing only spiropyran) were left under indoor ambient light for 4 hours. The degree of coloration of blank areas by the UV component of the indoor ambient light was measured as increased absorbance at 575 nm (maximum of absorbance of the colored form of the photochromic component). Sample #1 measured an absorption of 0.031, while sample #2 measured 0.046. Undesired coloration of blank areas in the unprotected document was higher by a factor of 1.5 times.

When the two samples were exposed to sunlight for 10 minutes through a window, the colorations were as follows: 0.13 for sample #1 and 0.30 for sample #2. The ratio of coloration was now 0.3/0.13=2.3. This example is an additional demonstration of protection by using UV light absorbing material when test devices were exposed to sunlight through a window. The sunlight contained a very large amount of UV light when compared with indoor light provided by a light bulb.

EXAMPLE 4

A device was prepared by two successive coatings as follows: first a film of spiropyran was spin-coated then a second layer containing the azobenzene material into PMMA polymeric binder was deposited on top. This configuration, having the protective material on top is advantageous over Example 3, because it ensures UV protection even for the photochromic molecules placed at the top of the photochromic film, which otherwise would be exposed to UV light below the predetermined wavelength scope. After 4 hours of exposure to indoor ambient light at ambient temperature, the absorption measured was about 0.030.

EXAMPLE 5

Other compounds are effective for UV protection under 365 nm region. A reimageable paper sheet was prepared by blade coating of regular white paper (XEROX™ multipurpose 1524 paper) with a solution containing 7.5 g of polymeric binder (polymethyl methacrylate, Mw=33,000) and 0.9 g of 1',3'-dihydro-1',3',3'-trimethyl-6-nitrospiro-(2H-1-benzopyran-2,2'-(2H)-indole (photochromic material) in 80 ml of THF. Separately, polymeric films containing UV light absorbing material below the predetermined wavelength scope were prepared by spin coating of solutions containing each of these compounds dissolved in polymer solutions in tetrahydrofuran on quartz substrates. These compounds included N-Benzylideneaniline, Methyl-p-benzoquinone and Anthraquinone.

Protection tests of these compounds for the reimageable sheet of paper were performed as follows. The sheet of paper in the white state was covered with quartz slides containing UV light absorbing materials and exposed to indoor sunlight through a window for about 10 to 30 minutes. In all cases, the areas covered with UV light absorbing polymeric films were less colored after exposure when compared with areas of the sheet of paper which was not covered, demonstrating that these UV light absorbing compounds were efficient for protecting blank areas of the paper sheet against undesired coloration due to UV component present in the indoor ambient light.

EXAMPLE 6

Samples were made on quartz slides with various compositions containing photochromic material into a polymeric binder. A stock polymeric solution was prepared by dissolving 15 g of PMMA 33K in 40 ml THF and 20 ml Toluene.

Two test samples were prepared by spin coating of polymeric solution containing different additives, as described below:

Sample #1: 150 mg spiropyran molecule in 5 ml PMMA stock solution. For sample #1, the blank (unwritten) areas of the reimageable medium appeared white.

Sample #2: 150 mg spiropyran, 20 mg azobenzene (first light absorbing material) and 15 mg yellow dye (second light absorbing material) in 5 ml PMMA stock solution. The yellow dye was menthyl anthranilate dodecyl pyridine. Sample #2, contained in addition to azobenzene, yellow dye which ensured protection at wavelengths above 365 nm (predetermined wavelength scope in this example). Due to the presence of yellow dye, the blank (unwritten) areas of the reimageable medium appeared yellow.

The increase of absorption at 575 nm was monitored in blank reimageable media, as a measure of undesired coloration, when exposed to indoor ambient light for 20 hours. The absorbance of sample #1 at 575 nm was 0.060, while the protected sample (#2) showed an absorption of 0.032, a decrease of coloration by a factor of 2.

When the samples were exposed to sunlight through a window, the coloration of blank areas was higher for both samples, but the protected sample #2 showed lower undesired coloration when compared with the unprotected sample #1. The measured absorptions were 0.232 (sample #1) and 0.103 (sample #2). Sample #1 appeared quite purple instead of initial white; while sample #2 was still yellow, due to much lower degree of coloration.

EXAMPLE 7

Two test samples were prepared. The substrate for each sample was a white paper sheet.

The first sample contained spiropyran with no light absorbing material and was prepared by dip-coating regular white paper (XEROX™ multipurpose 1524 paper) with a solution made of 1.87 g of PMMA and 0.45 g of 1',3'-dihydro-1',3',3'-trimethyl-6-nitrospiro-(2H-1-benzopyran-2,2'-(2H)-indole (photochromic material) dissolved in 20 ml of THF.

The second sample contained yellow dye in order to evaluate the effect of yellow dye alone. It was prepared in the same way by using a solution made of 1.87 g PMMA, 0.45 g of 1',3'-dihydro-1',3',3'-trimethyl-6-nitrospiro-(2H-1-benzopyran-2,2'-(2H)-indole (photochromic material) dissolved in 20 ml of THF and 0.10 g of menthyl anthranilate dodecyl pyridine (yellow dye). The yellow dye exhibits an absorption peak above the predetermined imaging scope.

The two samples were imaged by illumination with UV light of high intensity (365 nm; 4 mW/cm$^2$) for 20 seconds, then exposed to sunlight through a window for 15 minutes. The degree of purple coloration of the background of the first sample is significantly higher when compared with the second sample.

EXAMPLE 8

A sheet of white paper was impregnated with polymeric solution containing 7.5 g of PMMA and 0.9 g of (1',3'-dihydro-8-methoxy-1',3',3'-trimethyl-6-nitrospiro-(2H-1-benzopyran-2,2'-(2H)-indole) dissolved in 40 ml of xylene as a solvent, by dip coating. The sheet was dried at ambient temperature for 16 hours, then was heated for 20 min at 100 degrees C. The sheet of paper was illuminated with a LED at 396 nm through a mask for 30 seconds. Text was written in exposed areas of the paper sheet. The temporary image self-erased after being left for about 20 hours at the indoor ambient condition (indoor ambient light and darkness).

EXAMPLE 9

A sheet of white paper was coated by doctor-blade technique with the polymeric solution used in Example 8. Because the porosity of the paper, the paper was embedded with photochromic material. The sheet was dried at ambient temperature for 16 hours, then was heated for 20 min at 100 degrees C. Again, after drying, text was written by illumination through a mask with 365 nm wavelength light for 20 seconds. The temporary image self-erased after being left for about 20 hours at the indoor ambient condition (indoor ambient light and darkness). After erasure, the paper was illuminated with 396 nm wavelength light through a mask for 30 seconds which resulted in written text on the paper. A temporary image could be formed on the opposite side as well, by using a mask, but the coloration was lower when compared with the first side.

EXAMPLE 10

Regular white paper (XEROX™ multipurpose 1524 paper) was soaked into a solution containing 7.5 g of polymeric binder (polymethyl methacrylate, Mw=33,000) and 0.9 g of 1',3'-dihydro-1',3',3'-trimethyl-6-nitrospiro-(2H-1-benzopyran-2,2'-(2H)-indole (photochromic material) in 80 ml of THF. After dipping, the paper sheet was air dried, yielding a dry sheet of paper impregnated with the photochromic material with both sides of the paper being reimageable. On one side of the paper, a first temporary image was formed by illumination with UV light (365 nm) through a mask. Then another temporary image was formed on the opposite side with the same wavelength through a mask printing a different text. The intensity of coloration of the text was the same on both sides when the same light intensity and imaging light exposure times were used. The temporary images on both sides were visible for about 4 hours, and the temporary images completed faded away after about 16–20 hours (this total included the about 4 hours that the temporary image was visible) at the indoor ambient condition (indoor ambient light and darkness).

The invention claimed is:

1. A reimageable medium comprising:

a substrate; and a photochromic material havin a back reaction which can be induced thermally and optionally where the back reaction also can be induced by absorption of light, wherein the medium is capable of exhibiting a color contrast and an absence of the color contrast, wherein the medium has a characteristic that when the medium exhibits the absence of the color contrast and is then exposed to an imaging light corresponding to a predetermined image to result in an exposed region and a non-exposed region, the color contrast is present between the exposed region and the non-exposed region to form a temporary image corresponding to the predetermined image that is visible for a visible time, wherein the medium has a characteristic that when the temporary image is exposed to an indoor ambient condition for an image erasing time, the color contrast changes to the absence of the color contrast to erase the temporary image wherein the indoor ambient condition comprises darkness at ambient temperature, and wherein the medium is capable of undergoing multiple cycles of temporary image formation and temporary image erasure.

2. The medium of claim 1, wherein the medium has an additional characteristic that the color contrast changes to the absence of the color contrast to erase the temporary image in the following: (iv) when the medium is exposed to an elevated temperature generated by an image erasure device.

3. The medium of claim 1, wherein the medium has an additional characteristic that the color contrast changes to the absence of the color contrast to erase the temporary image in the following: (v) when the medium is exposed to an image erasure light generated by an image erasure device.

4. The medium of claim 1, wherein the imaging light is ultraviolet light.

5. The medium of claim 1, wherein the substrate is paper.

6. The medium of claim 1, wherein the substrate is plastic.

7. The medium of claim 1, wherein the medium is flexible.

8. The medium of claim 1, wherein the substrate is white paper.

9. The medium of claim 1, wherein the medium has two sides and the photochromic material is present on the two sides to enable the two sides to be both reimageable.

10. The medium of claim 1, wherein the visible time ranges from about 1 hour to about 5 days.

11. The medium of claim 1, wherein the visible time ranges from about 5 hours to about 24 hours.

12. The medium of claim 1, wherein the photochromic material comprises a spiropyran, a merocyanine, or both the spiropyran and the merocyanine which are reversibly convertible with each other.

13. The medium of claim 1, further comprising a binder.

14. A reimageable medium comprising:

a paper substrate; and a photochromic material having a back reaction which can be induced thermally and optionally where the back reaction also can be induced by absorption of light, wherein the medium is flexible with two sides and the photochromic material is present on the two sides to enable the two sides to be both reimageable, wherein the medium is capable of exhibiting a color contrast and an absence of the color contrast, wherein the medium has a characteristic that when the medium exhibits the absence of the color contrast and is then exposed to an imaging light corresponding to a predetermined image to result in an exposed region and a non-exposed region, the color contrast is present between the exposed region and the non-exposed region to form a temporary image corresponding to the predetermined image that is visible for a visible time, wherein the medium has a characteristic that when the temporary image is exposed to an indoor ambient condition for an image erasing time, the color contrast changes to the absence of the color contrast to erase the temporary image wherein the indoor ambient condition comprises darkness at ambient temperature, and wherein the medium is capable of undergoing multiple cycles of temporary image formation and temporary image erasure.

15. The medium of claim 14, wherein the medium has an additional characteristic that the color contrast changes to the absence of the color contrast to erase the temporary image in the following: (iv) when the medium is exposed to an elevated temperature generated by an image erasure device.

16. The medium of claim 14, wherein the medium has an additional characteristic that the color contrast changes to the absence of the color contrast to erase the temporary image in the following: (v) when the medium is exposed to an image erasure light generated by an image erasure device.

17. The medium of claim 14, wherein the imaging light is ultraviolet light.

18. The medium of claim 14, wherein the substrate is white paper.

19. The medium of claim 14, wherein the visible time ranges from about 1 hour to about 5 days.

20. The medium of claim 14, wherein the visible time ranges from about 5 hours to about 24 hours.

21. The medium of claim 14, wherein the photochromic material comprises a spiropyran, a merocyanine, or both the spiropyran and the merocyanine which are reversibly convertible with each other.

22. The medium of claim 14, further comprising a binder.

* * * * *